(12) United States Patent
Lee et al.

(10) Patent No.: US 10,950,544 B2
(45) Date of Patent: Mar. 16, 2021

(54) SEMICONDUCTOR DEVICE INCLUDING GATE PATTERN HAVING PAD REGION

(71) Applicant: SAMSUNG ELECTRONICS CO., LTD., Suwon-si (KR)

(72) Inventors: Dong Ik Lee, Hwaseong-si (KR); Dai Hong Kim, Suwon-si (KR); Ji Woon Im, Hwaseong-si (KR); Se Mee Jang, Seoul (KR); Bo Ra Nam, Busan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/445,021

(22) Filed: Jun. 18, 2019

(65) Prior Publication Data

US 2020/0091071 A1 Mar. 19, 2020

(30) Foreign Application Priority Data

Sep. 13, 2018 (KR) .................. 10-2018-0109777

(51) Int. Cl.
| | | |
|---|---|---|
| *H01L 23/528* | (2006.01) | |
| *H01L 27/11582* | (2017.01) | |
| *H01L 21/768* | (2006.01) | |
| *H01L 23/522* | (2006.01) | |
| *H01L 27/11565* | (2017.01) | |

(52) U.S. Cl.
CPC .... *H01L 23/5283* (2013.01); *H01L 21/76816* (2013.01); *H01L 21/76832* (2013.01); *H01L 23/5226* (2013.01); *H01L 27/11565* (2013.01); *H01L 27/11582* (2013.01)

(58) Field of Classification Search
CPC ............. H01L 23/5283; H01L 23/5226; H01L 21/76816; H01L 21/76832
See application file for complete search history.

(56) References Cited

U.S. PATENT DOCUMENTS

| | | | |
|---|---|---|---|
| 6,858,533 B2 | 2/2005 | Chu et al. | |
| 9,484,357 B2 | 11/2016 | Makala et al. | |
| 9,601,384 B2 | 3/2017 | Saino | |
| 9,786,762 B2 | 10/2017 | Yamaguchi et al. | |
| 9,929,279 B2 | 3/2018 | Yamazaki et al. | |
| 2011/0147824 A1* | 6/2011 | Son ..................... | H01L 29/7827 257/324 |
| 2015/0064900 A1 | 3/2015 | Lee et al. | |
| 2018/0047568 A1 | 2/2018 | Nguyen et al. | |

* cited by examiner

*Primary Examiner* — Marc Anthony Armand
(74) *Attorney, Agent, or Firm* — Volentine, Whitt & Francos, PLLC

(57) ABSTRACT

A semiconductor device includes a gate pattern disposed over a lower structure, and including a gate electrode region and a gate pad region extending from the gate electrode region; and a vertical channel semiconductor layer having a side surface facing the gate electrode region of the gate pattern. The gate pad region includes a first pad region having a thickness greater than a thickness of the gate electrode region. The first pad region includes an upper surface, a lower surface opposing the upper surface, and an outer side surface. The outer side surface has a lower outer side surface and an upper outer side surface, divided from each other by a boundary portion. The lower outer side surface extends from the lower surface, and a connection portion of the lower outer side surface and the lower surface has a rounded shape.

20 Claims, 31 Drawing Sheets

US 10,950,544 B2

SEMICONDUCTOR DEVICE INCLUDING GATE PATTERN HAVING PAD REGION

CROSS-REFERENCE TO RELATED APPLICATION

A claim for priority under 35 U.S.C. § 119 is made to Korean Patent Application No. 10-2018-0109777 filed on Sep. 13, 2018 in the Korean Intellectual Property Office, the disclosure of which is incorporated herein by reference in its entirety.

BACKGROUND

The present disclosure relates to semiconductor devices, and in particular to semiconductor devices including a gate pattern having a pad region with increased thickness.

In order to increase the price competitiveness of products, there is growing demand for improvement in the degree of integration of semiconductor devices. Furthermore, in order to improve the degree of integration of semiconductor devices, semiconductor devices having a three-dimensional structure in which gates are stacked on a substrate in a vertical direction have been developed.

SUMMARY

Embodiments of the inventive concepts provide semiconductor devices capable of improving the degree of integration thereof.

Embodiments of the inventive concepts provide a semiconductor device including a gate pattern disposed over a lower structure, and including a gate electrode region and a gate pad region extending from the gate electrode region; and a vertical channel semiconductor layer having a side surface facing the gate electrode region of the gate pattern. The gate pad region includes a first pad region having a thickness greater than a thickness of the gate electrode region. The first pad region includes an upper surface, a lower surface opposing the upper surface, and an outer side surface. The outer side surface has a lower outer side surface and an upper outer side surface, divided from each other by a boundary portion. The lower outer side surface extends from the lower surface, and a connection portion of the lower outer side surface and the lower surface has a rounded shape.

Embodiments of the inventive concepts further provide a semiconductor device including a first gate pattern over a lower structure; a second gate pattern over the first gate pattern; and an interlayer insulation layer between the first gate pattern and the second gate pattern. The first gate pattern includes a gate electrode region overlapping with the second gate pattern, and a gate pad region extending from the gate electrode region. The gate pad region includes a first pad region having a thickness greater than a thickness of the gate electrode region. The first pad region includes a lower region and an upper region on the lower region. The lower region includes a lower outer side surface having a convex shape.

Embodiments of the inventive concepts still further provide a semiconductor device including a lower structure; gate patterns spaced apart from each other in a direction perpendicular to an upper surface of the lower structure, the gate patterns including intermediate gate patterns; and a vertical channel semiconductor layer having a side surface facing the intermediate gate patterns. Each of the intermediate gate patterns includes a gate electrode region overlapping with a gate pattern from among the gate patterns, and a gate pad region extending from the gate electrode region. The gate pad region includes a first pad region, and a second pad region between the gate electrode region and the first pad region. The first pad region has a thickness greater than a thickness of the gate electrode region and a thickness of the second pad region. The first pad region includes a lower outer side surface, an upper outer side surface, and a boundary portion between the upper outer side surface and the lower outer side surface. A connection portion of a bottom surface of the first pad region and the lower outer side surface of the first pad region has a rounded shape.

BRIEF DESCRIPTION OF DRAWINGS

The above and other aspects, features, and advantages of the inventive concepts will be more clearly understood from the following detailed description, taken in conjunction with the accompanying drawings, in which.

DETAILED DESCRIPTION

Figure 1A:
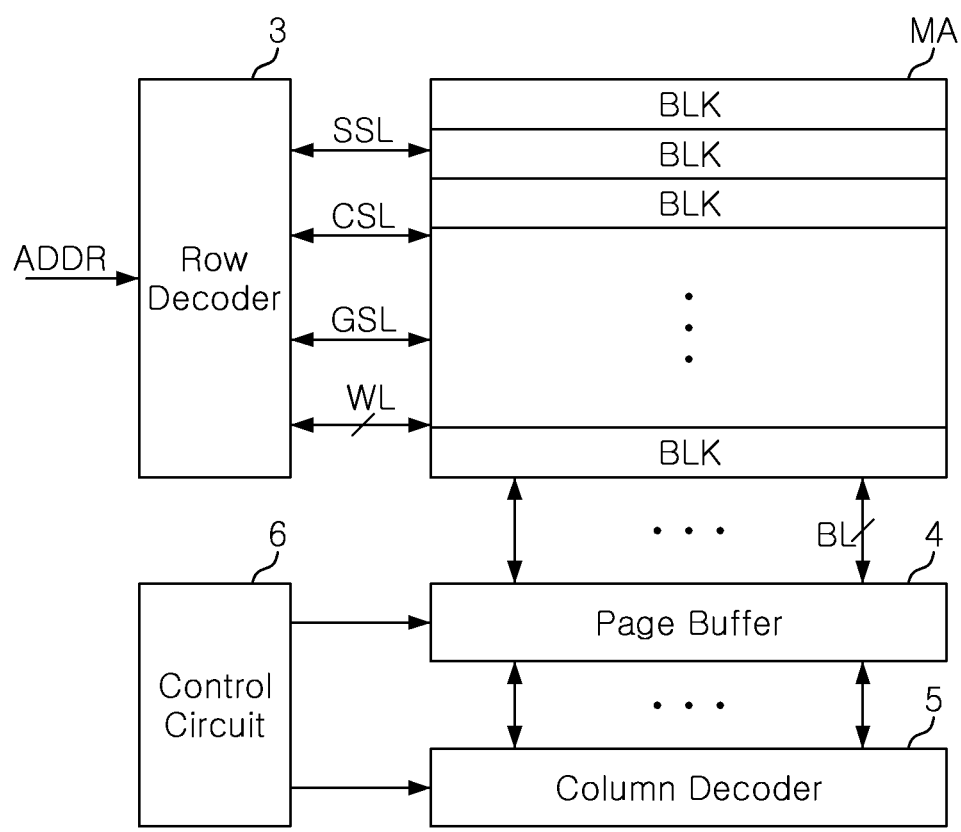
FIG. 1A illustrates a schematic block diagram of a semiconductor device according to an embodiment of the inventive concepts.

Hereinafter, exemplary embodiments of the present inventive concepts will be described with reference to the accompanying drawings.

Throughout this disclosure, directional terms such as "upper," "intermediate," "lower," and the like may be used herein to describe the relationship of one element or feature with another, and the inventive concepts should not be limited by these terms. Accordingly, these terms such as "upper," "intermediate," "lower," and the like may be replaced by other terms such as "first," "second," "third," and the like to describe the elements and features.

The thicknesses of layers and regions in the drawings may be exaggerated for the sake of clarity. Like reference numerals refer to like components throughout the specification.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

An exemplary embodiment of a semiconductor device according to an embodiment of the inventive concepts will be described with reference to FIG. 1A. FIG. 1A illustrates a schematic block diagram of a semiconductor device according to an embodiment of the inventive concepts.

Referring to FIG. 1A, a semiconductor device 1 according to an embodiment of the inventive concepts includes a memory array area MA, a row decoder 3, a page buffer 4, a column decoder 5, and a control circuit 6. The memory array area MA may include memory blocks BLK.

The memory array area MA may include memory cells arranged in a plurality of rows and columns. The memory cells included in the memory array area MA may include word lines WL, at least one common source line CSL, string selection lines SSL, at least one ground selection line GSL, and may be electrically connected to the page buffer 4 and the column decoder 5 through the bit lines BL.

In an embodiment, among the memory cells, the memory cells arranged in a same row may be connected to a same word line WL, and the memory cells arranged in a same column may be connected to a same bit line BL.

The row decoder 3 may be commonly connected to the memory blocks BLK, and may provide a driving signal to the word lines WL of the memory blocks BLK selected according to a block selection signal. For example, the row decoder 3 may receive address information ADDR from an external source (e.g., a host, not shown) and decode the received address information ADDR, to determine respective voltages supplied to at least a portion of the word lines WL, the common source line CSL, the string selection lines SSL, and the ground selection line GSL electrically connected to the memory blocks BLK.

The page buffer 4 may be electrically connected to the memory array area MA through the bit lines BL. The page buffer 4 may be connected to a bit line BL selected according to an address decoded from the column decoder 5. The page buffer 4 may temporarily store data to be stored in the memory cells, or sense data stored in the memory cells, according to an operation mode. For example, the page buffer 4 may operate as a writing driver circuit in a program operation mode, and as a sense amplifier circuit in a read operation mode. The page buffer 4 may receive power (e.g., voltage or current) from the control circuit 6, and may provide the same to a selected bit line BL.

The column decoder 5 may provide a data transmission path between the page buffer 4 and an external device (for example, a memory controller). The column decoder 5 may decode an externally input address to select any one of the bit lines BL.

The column decoder 5 may be commonly connected to the memory blocks BLK, and may provide data information to the bit lines BL of the selected memory block BLK according to a block selection signal.

The control circuit 6 may control the overall operation of the semiconductor device 1. The control circuit 6 may receive a control signal and an external voltage, and may operate according to the received control signal. The control circuit 6 may include a voltage generator that generates voltages necessary for internal operation (e.g., program voltage, read voltage, erase voltage, etc.) using the external voltage. The control circuit 6 may control read, write, and/or erase operations in response to control signals.

Figure 1B:
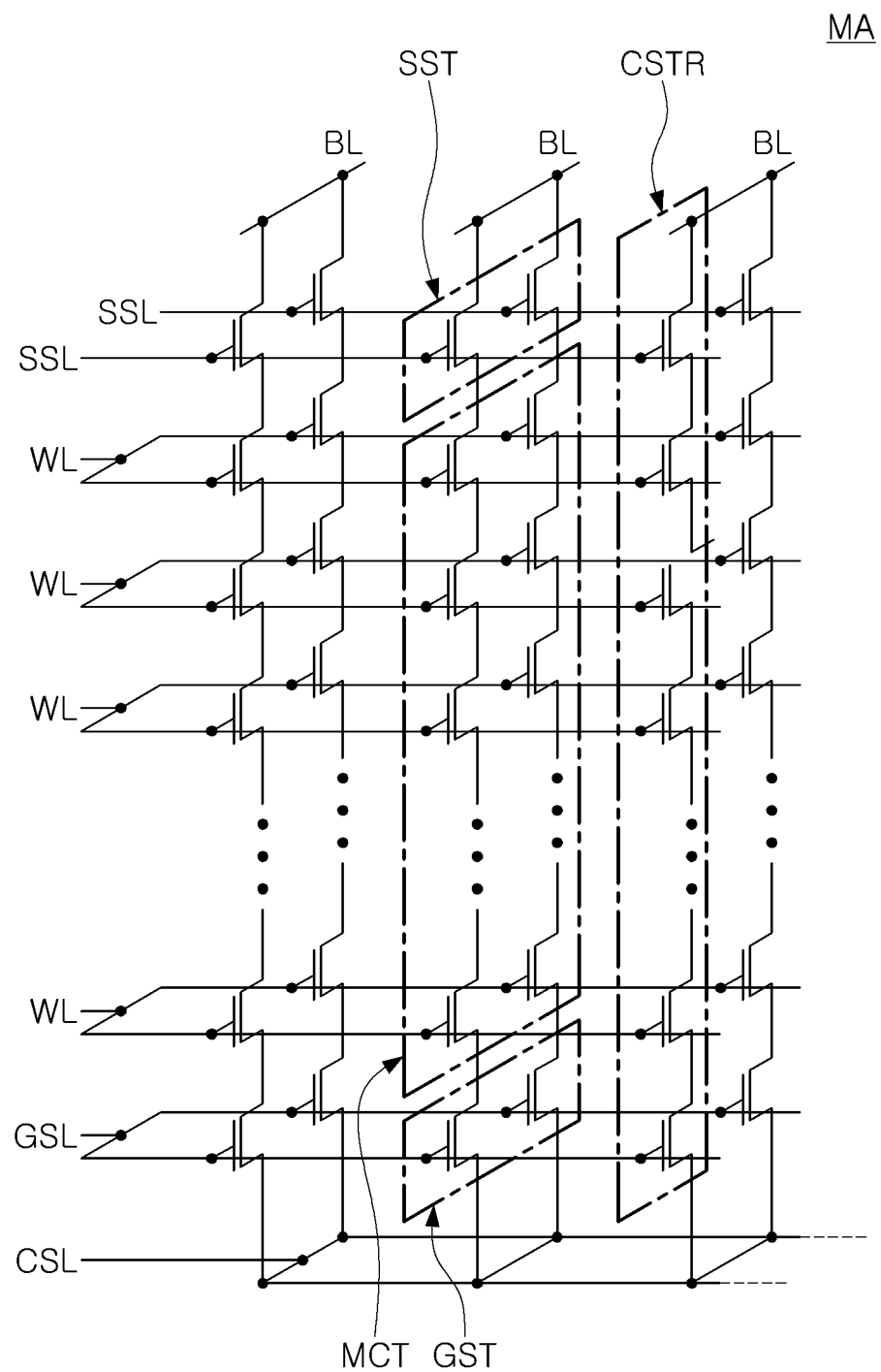
FIG. 1B illustrates a circuit diagram conceptually showing a memory array region of a semiconductor device according to an embodiment of the inventive concepts.

An exemplary embodiment of a circuit arranged in the memory array region (MA in FIG. 1A) of the semiconductor device 1 described in FIG. 1A will be described with reference to FIG. 1B. FIG. 1B illustrates a circuit diagram conceptually showing a memory array region (MA in FIG. 1A) of a semiconductor device according to an embodiment of the inventive concepts.

Referring to FIGS. 1A and 1B, a semiconductor device according to an embodiment of the inventive concepts includes a common source line CSL, bit lines BL, and a plurality of cell strings CSTR arranged between the common source line CSL and the bit lines BL. The common source line CSL, the bit lines BL, and the plurality of cell strings CSTR may be arranged in a memory array area MA.

The plurality of cell strings CSTR may be connected to each of the bit lines BL in parallel. The plurality of cell strings CSTR may be connected to the common source line CSL in common. Each of the plurality of cell strings CSTR may include a lower selection transistor GST, memory cells MCT and an upper selection transistor SST, which may be connected in series.

The memory cells MCT may be connected between the lower selection transistor GST and the upper selection transistor SST in series. Each of the memory cells MCT may include data storage regions, which may store data.

The upper selection transistor SST may be electrically connected to the bit lines BL, and the lower selection transistor GST may be electrically connected to the common source line CSL.

The upper selection transistors SST may be arranged in plural, and may be controlled by string selection lines SSL. That is, each of the plurality of cell strings CSTR may include more than one upper selection transistor SST connected in series. The memory cells MCT may be controlled by a plurality of word lines WL.

The lower selection transistor GST may be controlled by a ground selection line GSL. The common source line CSL may be connected to a source of the lower selection transistor GST. The sources of the lower selection transistors GST of the respective plurality of cell strings CSTR may be connected to the common source line CSL in common.

In an exemplary embodiment, the upper selection transistor SST may be a string selection transistor, and the lower selection transistor GST may be a ground selection transistor.

Next, an exemplary embodiment of a semiconductor device according to an embodiment of the inventive concepts will be described with reference to FIGS. 2A, 2B, 3, and 4A.

Figure 2A:
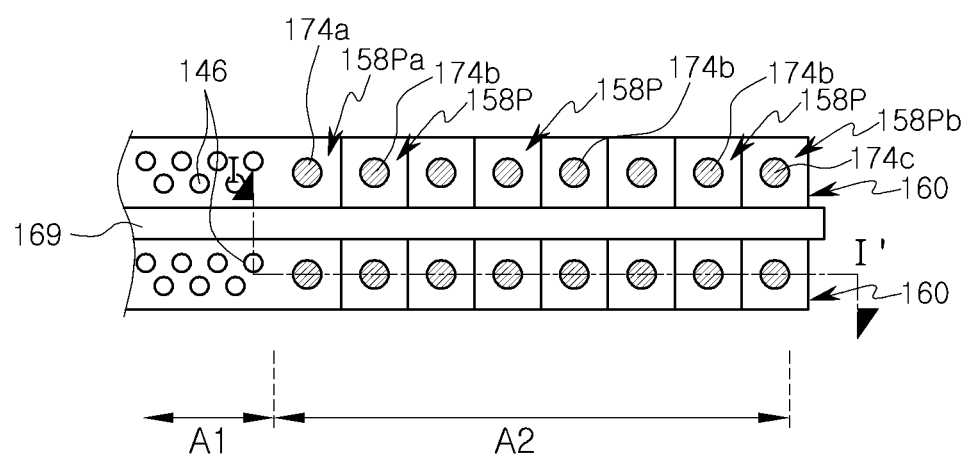
FIG. 2A illustrates a conceptual plan view of a semiconductor device according to an embodiment of the inventive concepts.
Figure 2B:
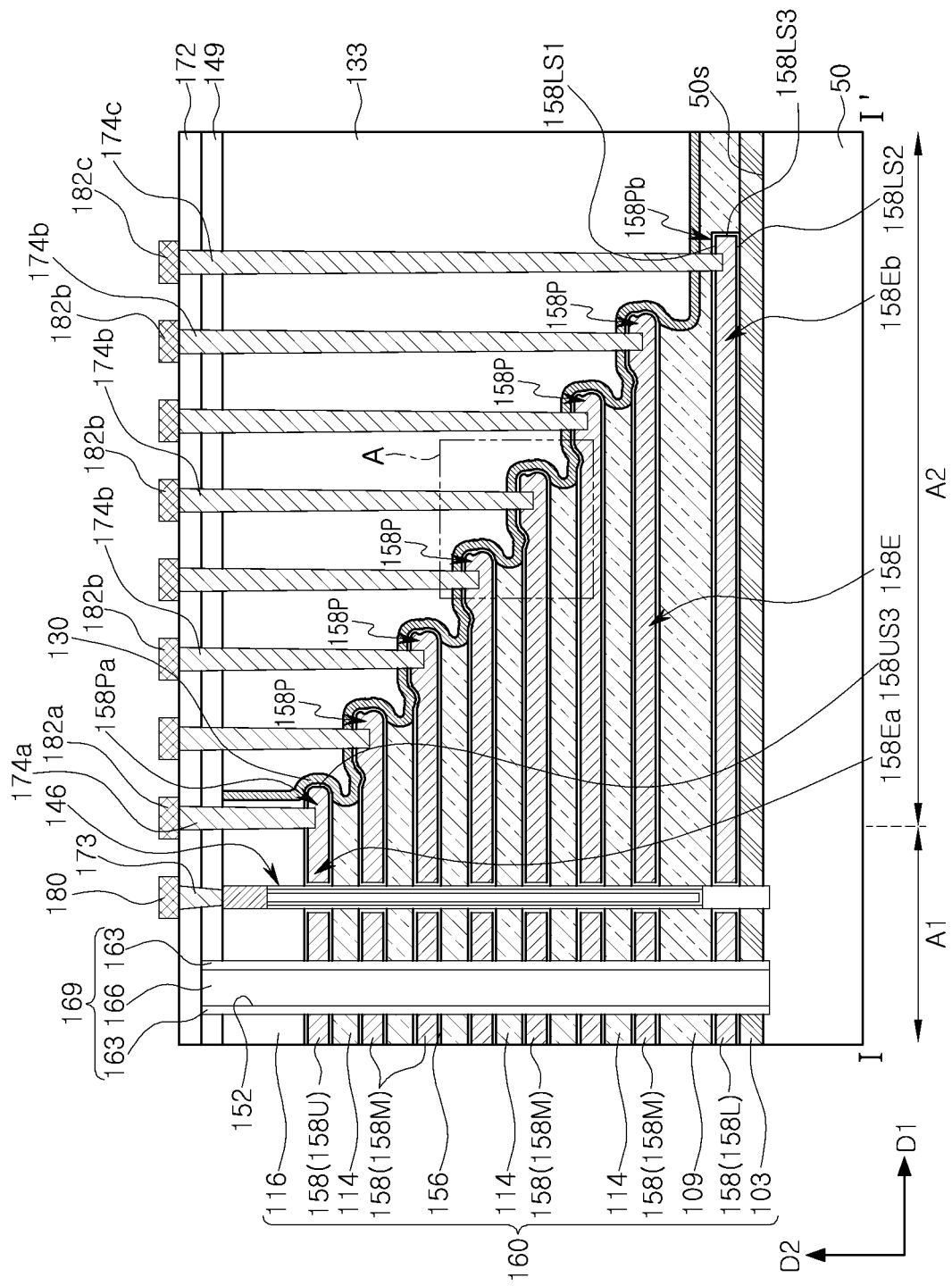
FIG. 2B illustrates a conceptual cross-sectional view of a semiconductor device according to an embodiment of the inventive concepts.
Figure 3:
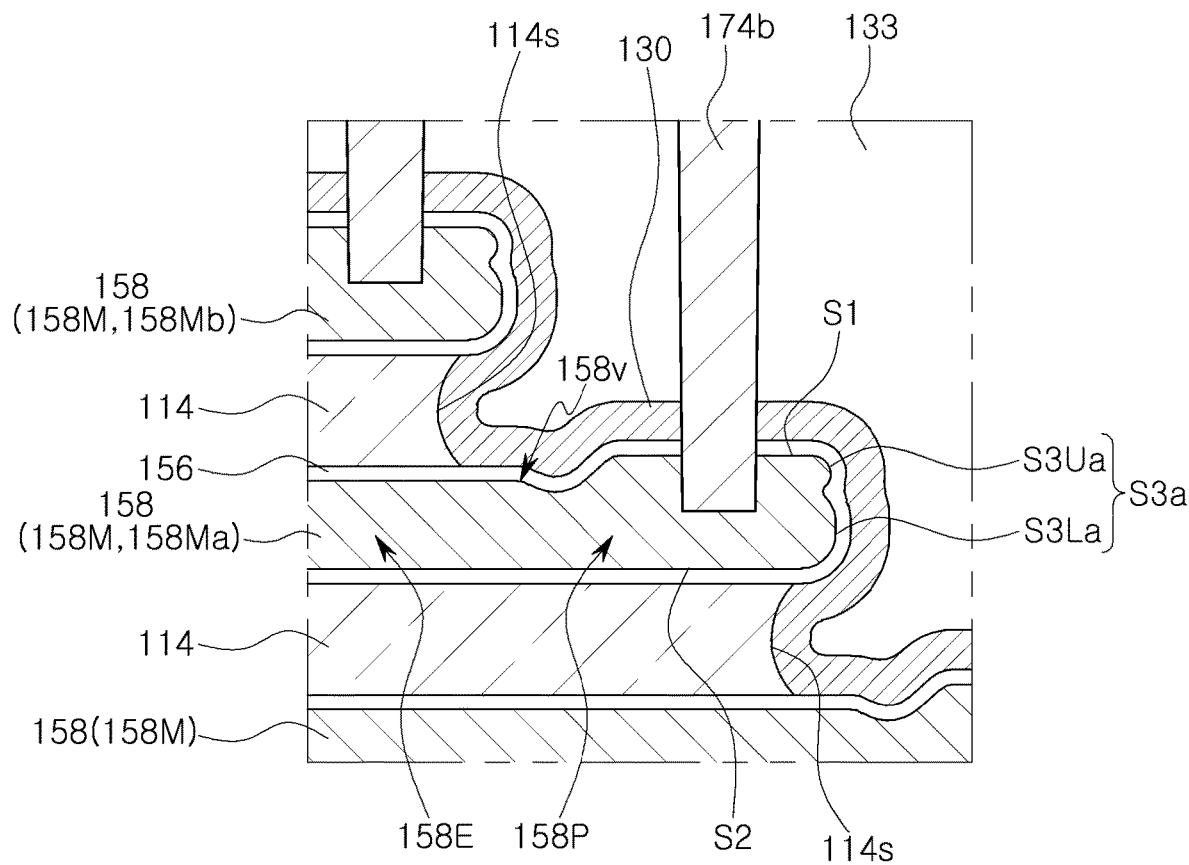
FIG. 3 illustrates a partially enlarged view of portion 'A' in FIG. 2B.
Figure 4A:
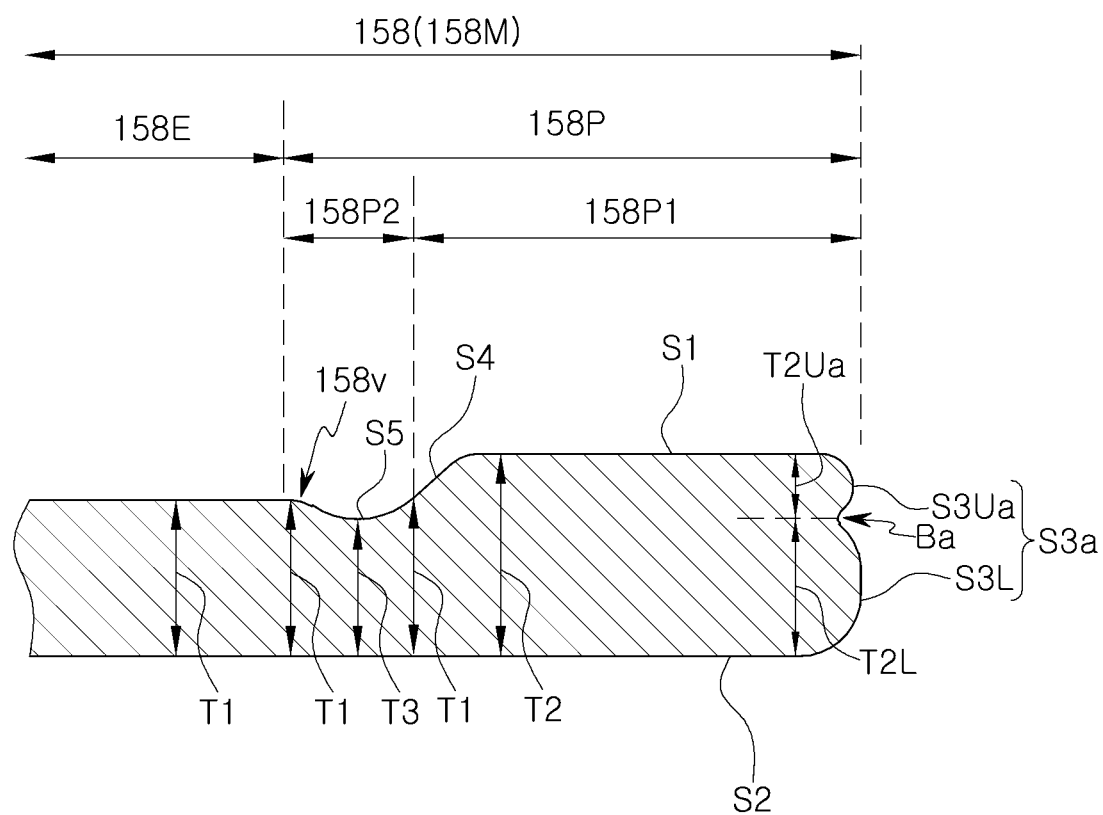
FIGS. 4A, 4B, 4C, 4D and 4E illustrate conceptual cross-sectional views of various embodiments of a portion of a semiconductor device according to embodiments of the inventive concepts.

FIG. 2A illustrates a conceptual plan view of a semiconductor device according to an embodiment of the inventive concepts. FIG. 2B illustrates a conceptual cross-sectional view of a region taken along a line I-I' in FIG. 2A. FIG. 3 illustrates a partially enlarged view of portion 'A' in FIG. 2B. FIG. 4A illustrates a conceptual cross-sectional view of a portion of any one of the gate patterns in FIG. 2B.

Referring to FIGS. 2A, 2B, 3, and 4A, a stacked structure 160 may be disposed on a lower structure 50. The lower structure 50 may be a semiconductor substrate. The stacked structure 160 may include a plurality of gate patterns 158.

The plurality of gate patterns 158 may be stacked in a first area A1 on the lower structure 50, while being spaced apart from each other in a vertical direction D2, and may extend into a second area A2 on the lower structure 50. The plurality of gate patterns 158 may extend in a horizontal direction D1 perpendicular to the vertical direction D2, and may extend into the second area A2 on the lower structure 50.

In embodiments, the vertical direction D2 may be perpendicular to an upper surface 50s of the lower structure 50. The horizontal direction D1 may be a direction parallel to the upper surface 50s of the lower structure 50.

The plurality of gate patterns 158 may include a lower gate pattern 158L, intermediate gate patterns 158M on (or over) the lower gate pattern 158L, and an upper gate pattern 158U on (or over) the intermediate gate patterns 158M. A dielectric layer 156 may be disposed on the gate patterns 158.

The plurality of gate patterns 158 may include gate electrode regions 158Ea, 158E, and 158Eb, and gate pad regions 158Pa, 158P, and 158Pb extending from the gate electrode regions 158Ea, 158E, and 158Eb. For example, the lower gate pattern 158L may include a lower gate electrode region 158Eb overlapping the intermediate gate patterns 158M in the vertical direction D2, and a lower gate pad region 158Pb not overlapping the intermediate gate patterns 158M in a vertical direction D2. Each of the intermediate gate patterns 158M may include an intermediate gate electrode region 158E overlapping a gate pattern positioned in a relatively upper portion of the gate patterns 158 in a vertical direction D2, and an intermediate gate pad region 158P not overlapping a gate pattern positioned in a relatively upper portion of the gate patterns 158 in the vertical direction D2 and extending from the intermediate gate electrode region 158E. The upper gate pattern 158U may include an upper gate electrode region 158Ea positioned in the first area A1, and an upper gate pad region 158Pa positioned in the second area A2.

The gate pad regions 158Pa, 158P, and 158Pb may be arranged in a stepped manner in the second area A2. The gate pad regions 158Pa, 158P, and 158Pb are not limited to the stepped shapes shown in the figures, and may be modified into various shapes.

In embodiments, the first area A1 may be a memory array area (MA in FIGS. 1A and 1B), or a region in which the memory array area (MA in FIGS. 1A and 1B) is disposed, as described in FIGS. 1A and 1B. Therefore, the first area A1 may be referred to as a "memory array area."

In embodiments, the second area A2 may be positioned on either side or both sides of the first area A1. The second area A2 may be an area in which the gate patterns 158 extend from the first area A1, and in which the gate pad regions 158Pa, 158P, and 158Pb are positioned. The second area A2 may be referred to as an "extension area" or a "connection area."

The stacked structure 160 may include interlayer insulation layers which are alternately and repeatedly stacked with the gate patterns 158. For example, the interlayer insulation layers may include a lowermost interlayer insulation layer 103, a lower interlayer insulation layer 109, intermediate interlayer insulation layers 114, and an upper interlayer insulation layer 116. The plurality of gate patterns 158 may be formed of a conductive material including for example at least one of a doped polysilicon, a metal nitride such as for example Titanium Nitride (TiN), a metal silicide such as for example Tungsten Silicide (WSi), Titanium Silicide (TiSi), or Tantalum Silicide (TaSi), or a metal such as for example Tungsten (W). The doped polysilicon may be polysilicon including an N-type impurity such as for example phosphorus (P) or arsenic (As), or a P-type impurity such as for example boron (B). The interlayer insulation layers may be formed of an insulating material including such as for example silicon oxide.

The lowermost interlayer insulation layer 103 may be disposed on (or over) the lower structure 50, and may be disposed in a position lower than a position of the lower gate pattern 158L. The lower interlayer insulation layer 109 may be disposed on the lowermost interlayer insulation layer 103, may cover the lower gate pattern 158L, and may be disposed in a position lower than a position of a lowermost intermediate gate pattern among the intermediate gate patterns 158M. Each of the intermediate interlayer insulation layers 114 may be disposed between two gate patterns spaced apart from each other in the vertical direction D2 among intermediate and upper gate patterns 158M and 158U arranged in a position higher than a position of the lower gate pattern 158L. The upper interlayer insulation layer 116 may be disposed on (or over) the upper gate pattern 158U. Each of the intermediate interlayer insulation layers 114 may have a recessed side surface 114s between gate patterns 158 neighboring in upward and downward directions. For example, gate patterns 158 neighboring in upward and downward directions may have a shape protruding (i.e., extending) in a direction parallel to the upper surface 50s of the lower structure 50 more than or beyond the intermediate interlayer insulation layers 114 between the gate patterns 158 neighboring in upward and downward directions. For example, as shown in FIG. 3, intermediate gate patterns 158M neighboring in upward and downward directions may include a first gate pattern 158Ma, and a second gate pattern 158Mb on (or over) the first gate pattern 158Ma, and any one intermediate interlayer insulation layer 114 may be disposed between the first gate pattern 158Ma and the second gate pattern 158Mb. The intermediate interlayer insulation layer 114 may have a side surface between the first and second gate patterns 158Ma and 158Mb, and the second gate pattern 158Mb may have a shape protruding (i.e., extending) in a direction parallel to the upper surface 50s of the lower structure 50 more than or beyond the intermediate interlayer insulation layers 114.

A first capping insulation layer 133 may be disposed to cover the lower and intermediate gate pad regions 158Pb and 158P. The first capping insulation layer 133 may have an upper surface coplanar with the upper interlayer insulation layer 116.

In an exemplary embodiment, an insulation liner 130 covering the intermediate gate pad regions 158P and extending between the upper interlayer insulation layer 116 and the first capping insulation layer 133 may be disposed. The insulation liner 130 may be formed of silicon oxide for example.

A memory vertical structure 146 passing through the stacked structure 160 may be disposed. The dielectric layer 156 may cover an upper surface and lower surface of each of the gate patterns 158, may extend to side surface of each of the gate patterns 158 facing the memory vertical structure 146, and may extend to an outer side surface of each of the gate pad regions 158Pa, 158P and 158Pb. A portion of the dielectric layer 156 may be between the insulation liner 130 and each of the upper and the intermediate gate patterns 158U and 158M.

A second capping insulation layer 149 covering the stacked structure 160 and the first capping insulation layer 133, and a third capping insulation layer 172 on the second capping insulation layer 149 may be arranged.

A trench 152 passing through the stacked structure 160 and the second capping insulation layer 149 may be disposed. A separation structure 169 may be disposed in the trench 152. The separation structure 169 may include a separation pattern 166, and separation spacers 163 on side surfaces of the separation pattern 166. In an exemplary embodiment, the separation pattern 166 may be formed of a conductive material including for example at least one of a doped polysilicon, a metal nitride such as for example Titanium Nitride (TiN), a metal silicide such as for example Tungsten Silicide (WSi), Titanium Silicide (TiSi), or Tantalum Silicide (TaSi), or a metal such as for example Tungsten (W), and the separation spacers 163 may be formed of an insulating material including such as silicon oxide for example.

A bit line contact plug 173 passing through the second and third capping insulation layers 149 and 172 may be disposed on the memory vertical structure 146. An upper gate contact plug 174a passing through the upper interlayer insulation layer 116 and the second and third capping insulation layers 149 and 172 may be disposed on the upper gate pad region 158Pa. Intermediate gate contact plugs 174b passing through the first to third capping insulation layers 133, 149, and 172 may be disposed on the intermediate gate pad regions 158P. A lower gate contact plug 174c passing through the first to third capping insulation layers 133, 149, and 172 may be disposed on the lower gate pad regions 158Pb. The upper gate contact plug 174a, the intermediate gate contact plugs 174b and the lower gate contact plug 174c may be formed of a conductive material including for example at least one of a doped polysilicon, a metal nitride such as for example Titanium Nitride (TiN), a metal silicide such as for example Tungsten Silicide (WSi), Titanium Silicide (TiSi), or Tantalum Silicide (TaSi), or a metal such as Tungsten (W) for example.

A bit line 180 may be disposed on the bit line contact plug 173. An upper gate connection wiring line 182a may be disposed on the upper gate contact plug 174a, intermediate gate connection wiring lines 182b may be disposed on the intermediate gate contact plugs 174b, and a lower gate connection wiring line 182c may be disposed on the lower gate contact plug 174c.

In an embodiment, at least one or more gate patterns among the gate patterns 158 may include a gate electrode region, and a gate pad region including a pad region having an increased thickness greater than a thickness of the gate electrode region. For example, in an embodiment, each of the intermediate gate patterns 158M may include regions having different thicknesses. For example, each of the intermediate gate pad regions 158P of the intermediate gate patterns 158M may include a pad region having a relatively increased thickness that is greater than a thickness of the intermediate gate patterns 158M.

Hereinafter, an embodiment of the intermediate gate patterns 158M including the intermediate gate pad region 158P including the pad region having the increased thickness will be described with reference to FIG. 4A.

FIG. 4A illustrates a conceptual cross-sectional view of the intermediate gate pad region 158P of the intermediate gate pattern 158M of any one of the gate patterns 158. The cross-sectional view of FIG. 4A may be seen to include a cross-section of the intermediate gate pad region 158P that does not overlap the intermediate contact plug 174b in the plan view of the gate pad region 158P of FIG. 2A.

Referring to FIG. 4A, together with FIGS. 1A to 3, an intermediate gate pattern 158M may include an intermediate gate electrode region 158E, and an intermediate gate pad region 158P extending from the intermediate gate electrode region 158E.

The intermediate gate pad region 158P may include a first pad region 158P1 having a thickness T2 greater than a thickness T1 of the intermediate gate electrode region 158E.

The first pad region 158P1 may have an upper surface S1, a lower surface S2, and an outer side surface S3a. The upper surface S1 and the lower surface S2 may be opposed to each other.

The outer side surface S3a may include a lower outer side surface S3L, an upper outer side surface S3Ua on the lower outer side surface S3L, and a boundary portion Ba between the lower outer side surface S3L and the upper outer side surface S3Ua. The upper outer side surface S3Ua and the lower outer side surface S3L may be divided by the boundary portion Ba.

The lower outer side surface S3L extends from the lower surface S2 in (or as having) a rounded shape. In other words, a connecting portion of the lower surface S2 and the lower outer side surface S3L has a rounded shape. For example, the lower outer side surface S3L may have a convex shape in an outward direction.

The upper outer side surface S3Ua extends from the upper surface S1 in (or as having) a rounded shape. In other words, a connecting portion of the upper surface S1 and the upper outer side surface S3Ua has a rounded shape. For example, the upper outer side surface S3Ua may have a convex shape in an outward direction. The boundary portion Ba may have a concave shape formed by connecting the upper outer side surface S3Ua having convex shape and the lower outer side surface S3L having convex shape.

The first pad region 158P1 may include a lower region T2L having the lower outer side surface S3L, and an upper region T2Ua having the upper outer side surface S3Ua.

In an exemplary embodiment, a thickness of the lower region T2L may be greater than a thickness of the upper region T2Ua.

The intermediate gate pad region 158P may include a second pad region 158P2 between the first pad region 158P1 and the intermediate gate electrode region 158E.

The second pad region 158P2 may include a portion having a thickness T3 smaller than a thickness T2 of the first pad region 158P1. The second pad region 158P2 may have a recessed upper surface S5.

In an exemplary embodiment, in the second pad region 158P2, a portion 158v at the start of recessed upper surface S5 has a thickness smaller than a thickness T1 of the intermediate gate electrode region 158E. In other words, position 158v at which formation of the recessed upper surface S5 starts is positioned away from the intermediate gate electrode region 158E.

In an exemplary embodiment, the first pad region 158P1 may include a raised side surface S4 opposing the upper outer side surface S3Ua. The raised side surface S4 may be a side surface of a region in the first pad region 158P1. The thickness of the first pad region 158P1 at the raised side surface S4 is greater than a thickness T1 of the intermediate gate electrode region 158E. The raised side surface S4 may be formed to have a slope forming an obtuse angle with the upper surface S1.

In embodiments of the inventive concepts, the upper region T2Ua may be modified to have various different forms. Embodiments of the upper region modified to have various different forms will be respectively described with reference to FIGS. 4B, 4C, 4D, and 4E.

Each of FIGS. 4B, 4C, 4D, and 4E illustrate a cross-sectional view schematically showing a modified embodiment of the intermediate gate pattern 158M including the intermediate gate pad region 158P. The same reference numerals refer to the same elements throughout the specification. In the following description with reference to each of FIGS. 4B to 4E, elements of the same reference numerals which have been described with reference to FIG. 4A may be referred to directly or detailed description thereof may be omitted.

Figure 4B:
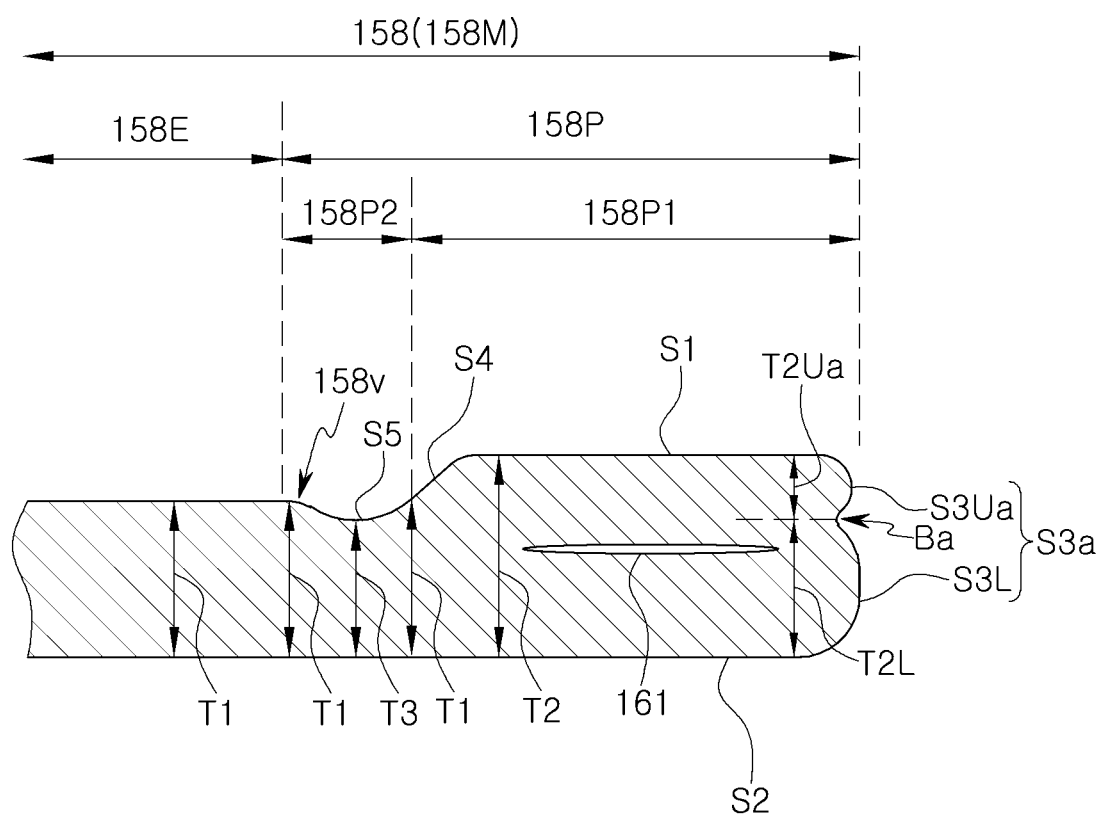

In the modified embodiment as shown in FIG. 4B, the intermediate gate pad region 158P may include one or more voids 161 that may be formed in the first pad region 158P1.

Figure 4C:
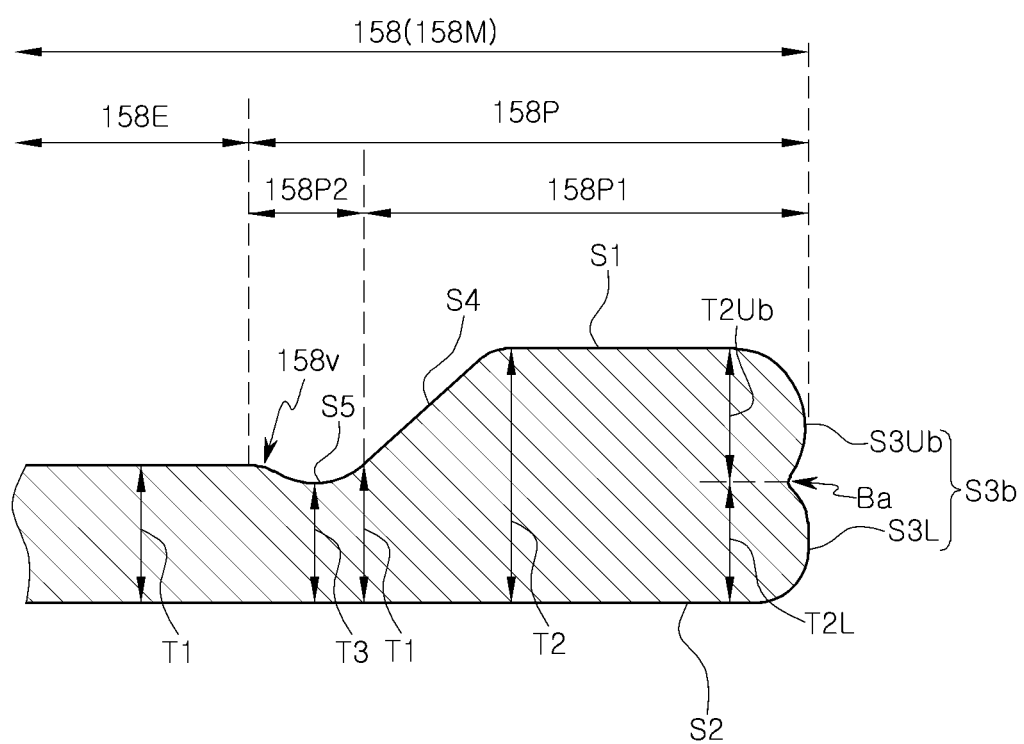

In the modified embodiment as shown in FIG. 4C, the first pad region 158P1 of the intermediate gate pattern 158M may include an upper region T2Ub having a thickness greater than the thickness of the lower region T2L described previously. The outer side surface S3b of the first pad region 158P1 may include an upper outer side surface S3Ub of the upper region T2Ub and a lower outer side surface S3L of a lower region T2L. The upper outer side surface S3Ub of the upper region T2Ub may have a convex shape. A boundary portion Ba between the upper outer side surface S3Ub of the upper region T2Ub and the lower outer side surface S3L of the lower region T2L may have a concave shape.

Figure 4D:
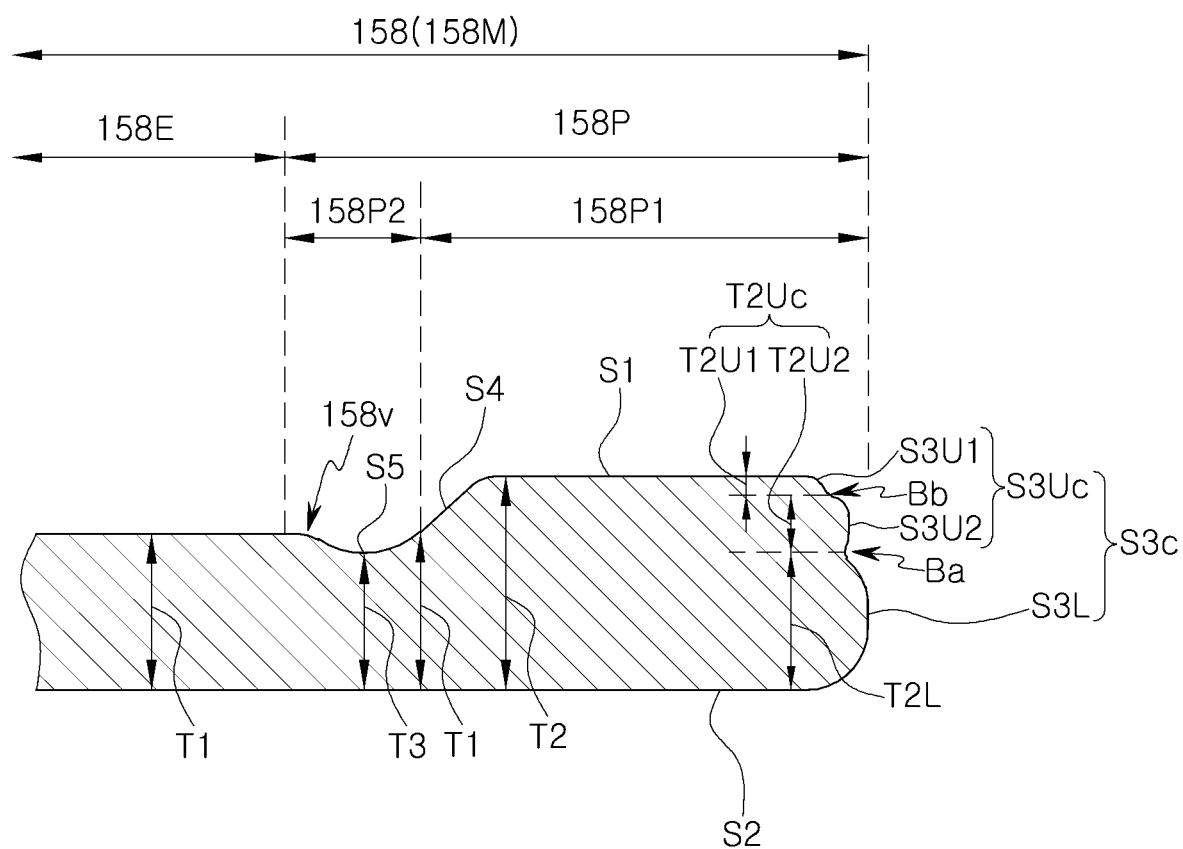

In the modified embodiment as shown in FIG. 4D, the first pad region 158P1 of the intermediate gate pattern 158M may include the lower region T2L described previously, and an upper region T2Uc on the lower region T2L.

The upper region T2Uc may include a first upper region T2U1, and a second upper region T2U2 between the first upper region T2U1 and the lower region T2L.

An outer side surface S3c of the first pad region 158P1 may be connected to a first upper outer side surface S3U1 of the first upper region T2U1 and a second upper outer side surface S3U2 of the second upper region T2U2, and a lower outer side surface S3L of the lower region T2L.

The second upper outer side surface S3U2 may have a convex shape. Therefore, a boundary portion Ba between the second upper outer side surface S3U2 of the convex shape and the lower outer side surface S3L of the convex shape may have a concave shape.

The first upper outer side surface S3U1 may have a sloped shape. For example, the first upper outer side surface S3U1 may be formed to have a slope forming an obtuse angle with respect to the upper surface S1.

In an exemplary embodiment, the first upper outer side surface S3U1 may extend at an obtuse angle with the upper surface S1, and the second upper outer side surface S3U2 may extend from the first upper outer side surface S3U1 at a slope different from the first upper outer side surface S3U1.

In an exemplary embodiment, the first upper outer side surface S3U1 may be formed to have a slope forming an obtuse angle with the upper surface S1, and the second upper outer side surface S3U2 may be formed to have a convex shape.

The first upper region T2U1 and the second upper region T2U2 may be divided from each other, based on a boundary portion Bb between the first upper outer side surface S3U1 and the second upper outer side surface S3U2.

In an exemplary embodiment, the lower outer side surface S3L may protrude further in a lateral direction than the upper outer side surface S3Uc.

In an exemplary embodiment, a thickness of the lower region T2L may be greater than a thickness of the upper region T2Uc.

Figure 4E:
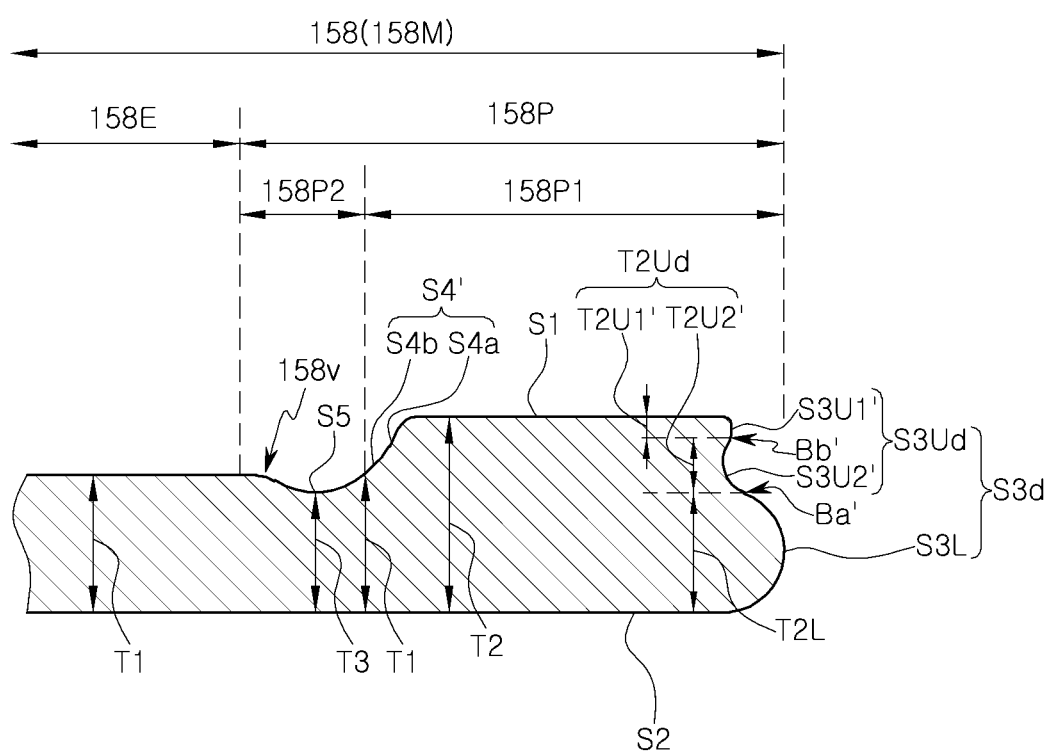

In the modified embodiment as shown in FIG. 4E, the first pad region 158P1 of the intermediate gate pattern 158M may include the lower region T2L described previously, and an upper region T2Ud on the lower region T2L. The upper region T2Ud may include a first upper region T2U1' and a second upper region T2U2' between the first upper region T2U1' and the lower region T2L.

The outer side surface S3d of the first pad region 158P1 may include a first upper outer side surface S3U1' of the first upper region T2U1', a second upper outer side surface S3U2' of the second upper region T2U2', and a lower outer side surface S3L of the lower region T2L.

The second upper outer side surface S3U2' may have a concave shape. Therefore, a boundary portion Ba' between the second upper outer side surface S3U2' and the lower outer side surface S3L, which may divide the second upper outer side surface S3U2' of the concave shape from the lower outer side surface S3L of the convex shape, may be an inflection portion.

The first upper outer side surface S3U1' may have a convex shape. Therefore, a boundary portion Bb' between the first upper outer side surface S3U1' and the second upper outer side surface S3U2', which may divide the first upper outer side surface S3U1' of the convex shape from the second upper outer side surface S3U2' of the concave shape, may be an inflection portion.

The first upper region T2U1' may have a raised side surface S4' facing the upper outer side surface S3Ud.

The raised side surface S4' of the first upper region T2U1' may include a first raised side surface S4a extending from the upper surface S1, and a second raised side surface S4b extending from the first raised side surface S4a.

In an exemplary embodiment, the second raised side surface S4*b* may be formed to have a more acute slope than the first raised side surface S4*a*. For example, the first raised side surface S4*a* may form an obtuse angle with the upper surface S1.

In an exemplary embodiment, the lower outer side surface S3L of the lower region T2L may protrude further in a lateral direction than the upper outer side surface S3Ud of the upper region T2Ud.

Referring to FIGS. 3 and 4A again, as described previously, the second pad region 158P2 of the intermediate gate pattern 158M may have a recessed upper surface S5, and may thus include a portion having a thickness T3 smaller than the thickness T1 of the gate electrode region 158E. The inventive concepts are not limited thereto, and may be modified as in FIGS. 5A and 5B.

Figure 5A:
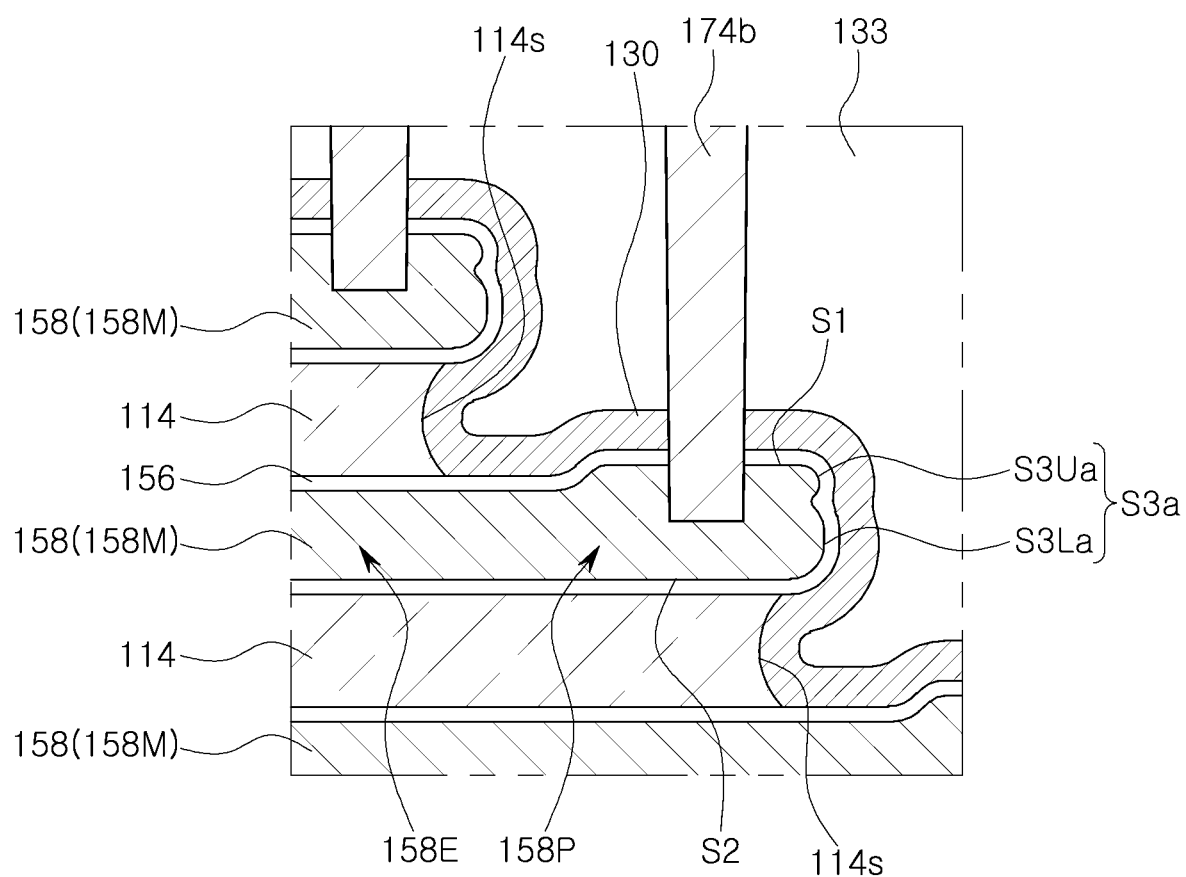
FIG. 5A illustrates a partially enlarged cross-sectional view of a portion of a semiconductor device according to a modified embodiment of the inventive concepts.
Figure 5B:
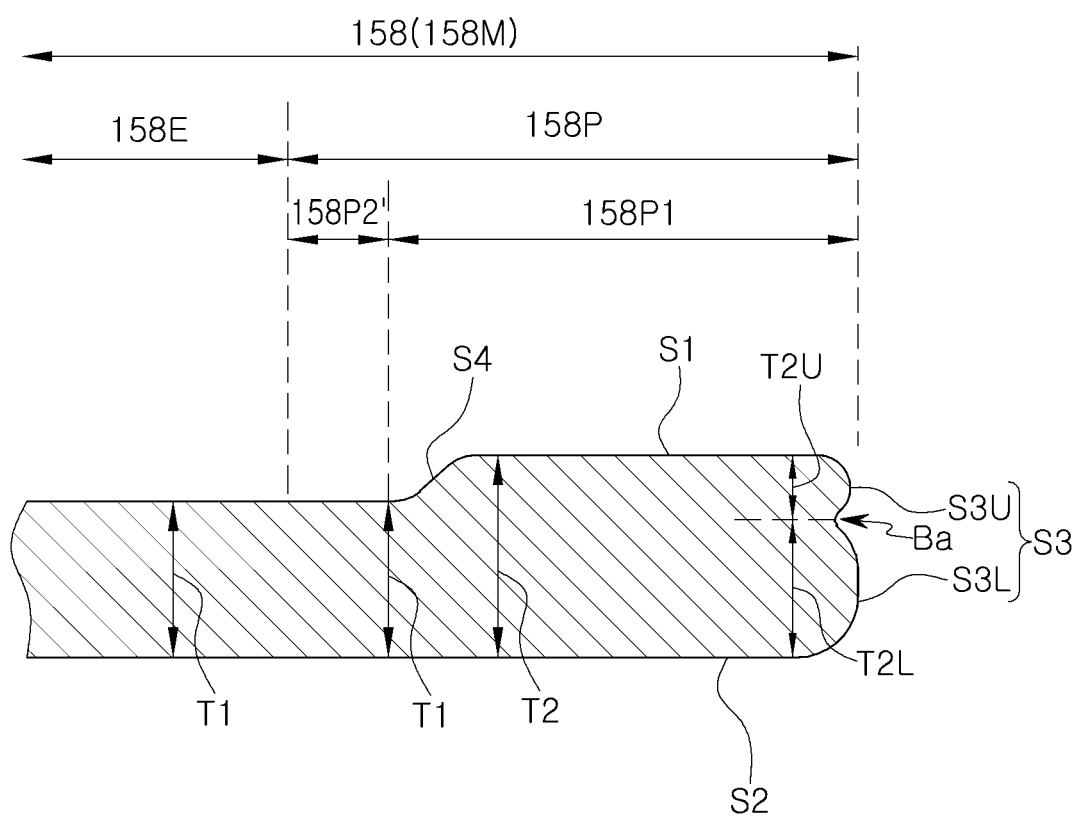
FIG. 5B illustrates an enlarged conceptual cross-sectional view of the semiconductor device according to the modified embodiment of FIG. 5A.

FIG. 5A illustrates a partially enlarged cross-sectional view of a portion (corresponding to FIG. 3) of a semiconductor device according to a modified embodiment of the inventive concepts. FIG. 5B illustrates an enlarged conceptual cross-sectional view according to the modified embodiment of FIG. 5A.

In the modified embodiment as shown in FIGS. 5A and 5B, in any one of the intermediate gate patterns 158M, an intermediate gate pad region 158P may include a first pad region 158P1, and a second pad region 158P2' between the first pad region 158P1 and the intermediate gate electrode region 158E.

The second pad region 158P2' may have a thickness T1 substantially equal to that of the intermediate gate electrode region 158E.

The first pad region 158P1 shown in FIG. 5B may be the same as any one of the first pad regions illustrated in FIGS. 4A to 4E. Accordingly, in this case of FIG. 5B, outer side surface and the upper outer side surface have been respectively denoted generally as S3 and S3U.

Referring to FIGS. 2B and 3 again, in each of the intermediate gate patterns 158M described above, the outer side surface S3*a* of the intermediate gate pad region 158P may extend from the upper surface S1 in (or as having) a rounded shape, and may extend from the lower surface S2 in (or as having) a rounded shape. That is, a connecting portion of the upper surface S1 and the outer side surface S3*a* has a rounded shape, and a connecting portion of the lower surface S2 and the outer side surface S3*a* has a rounded shape.

Referring again to FIG. 2B, in an exemplary embodiment an outer side surface 158LS3 of the lower gate pad region 158Pb of the lower gate pattern 158L may be substantially perpendicular to a lower surface 158LS2 and an upper surface 158LS1 of the lower gate pattern 158L. For example, the outer side surface 158LS3 of the lower gate pad region 158Pb of the lower gate pattern 158L may have a straight linear shape. Accordingly, a shape between the outer side surface S3*a* and the lower surface S2 of the intermediate gate pad region 158P as shown in FIG. 3 may have a more rounded shape than a shape between the outer side surface 158LS3 and the lower surface 158LS2 of the lower gate pad region 158Pb of the lower gate pattern 158L as shown in FIG. 2B.

In an exemplary embodiment, an outer side surface 158US3 of the upper gate pad region 158Pa of the upper gate pattern 158U as shown in FIG. 2B may have a convex shape formed by extending the bottom and upper surfaces of the upper gate pad region 158Pa respectively in (or as having) rounded shape in upward and downward directions. In other words, a connecting portion of the upper surface of the upper gate pad region 158Pa and the outer side surface 158US3 has a rounded shape, and a connecting portion of the lower surface of the upper gate pad region 158Pa and the outer side surface 158US3 has a rounded shape. The outer side surface 158US3 of the upper gate pad region 158Pa of the upper gate pattern 158U may have a more convex shape than the outer side surface 158LS3 of the lower gate pad region 158Pb of the lower gate pattern 158L. Accordingly, a shape between the outer side surface 158US3 of the upper gate pad region 158Pa and a bottom surface of the upper gate pad region 158Pa of the upper gate pattern 158U may have a more rounded shape than a shape between the outer side surface 158LS3 and the lower surface 158LS2 of the lower gate pad region 158Pb of the lower gate pattern 158L.

Next, an exemplary embodiment of the memory vertical structure 146 described with reference to FIGS. 2A, 2B and 3 will be described with reference to FIG. 6.

Figure 6:
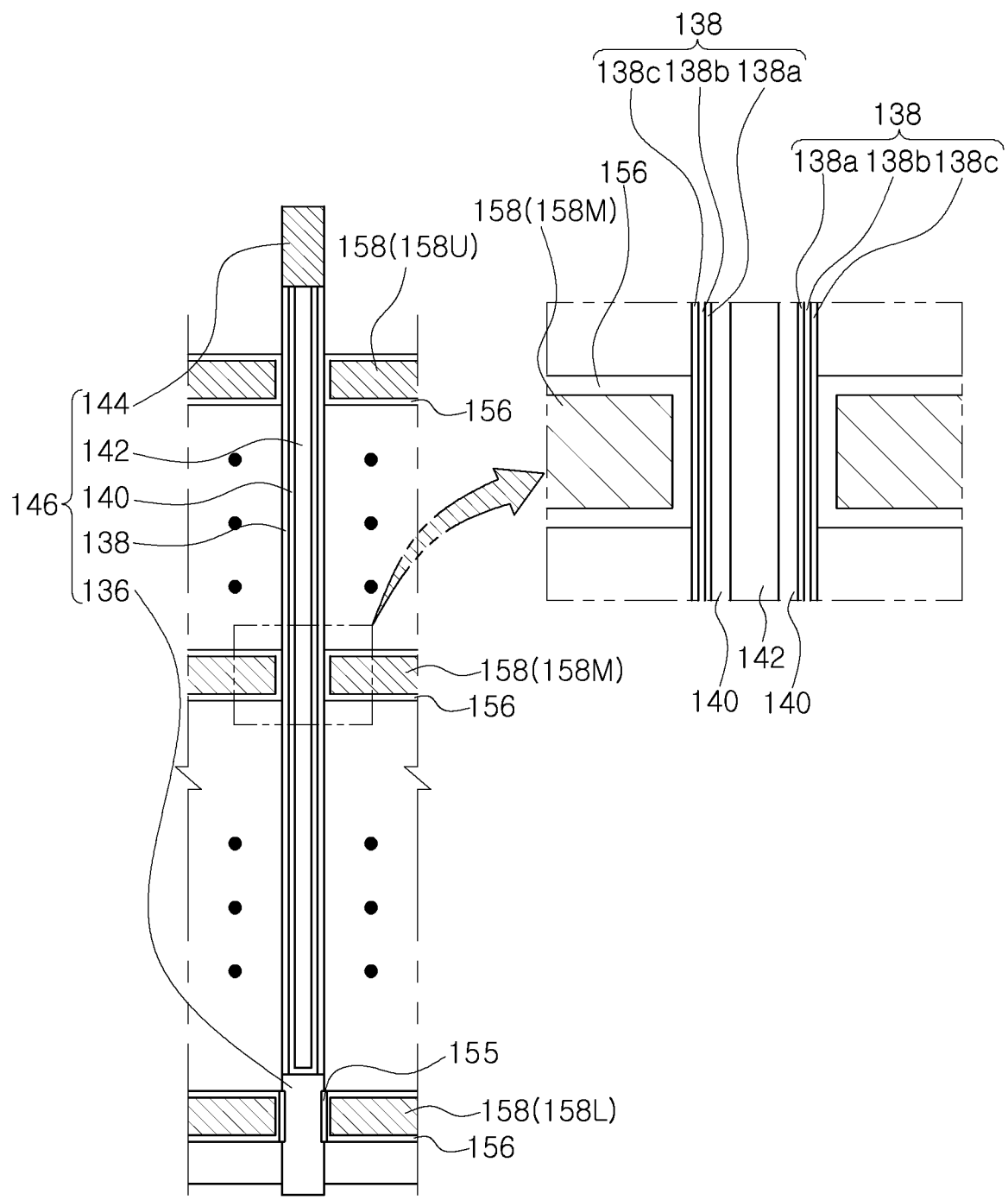
FIG. 6 illustrates a cross-sectional view conceptually showing a portion of a semiconductor device according to an embodiment of the inventive concept.

FIG. 6 illustrates a cross-sectional view conceptually showing a portion of a semiconductor device according to an embodiment of the inventive concepts.

Referring to FIG. 6, together with FIGS. 2A, 2B and 3, the memory vertical structure 146 includes a vertical channel semiconductor layer 140, and a gate dielectric structure 138 disposed between the vertical channel semiconductor layer 140 and the gate patterns 158.

In an exemplary embodiment, the memory vertical structure 146 may further include a semiconductor pattern 136, a vertical core pattern 142 on the semiconductor pattern 136, and a pad pattern 144 on the vertical core pattern 142.

The vertical channel semiconductor layer 140 may be disposed to contact the semiconductor pattern 136 and surround an outer side surface of the vertical core pattern 142. The gate dielectric structure 138 may be disposed to surround an outer side surface of the vertical channel semiconductor layer 140. The semiconductor pattern 136 may be an epitaxial material layer that may be formed by a SEG process. The vertical core pattern 142 may be formed of an insulating material (e.g., silicon oxide or the like). The pad pattern 144 may for example be formed of polysilicon having an N-type conductivity. The pad pattern 144 may be disposed on a higher level than the upper gate pattern 158U. The pad pattern 144 of the memory vertical structure 146 may be in contact with and electrically connected to the bit line contact plug 173 previously described.

In an exemplary embodiment, the vertical channel semiconductor layer 140 may have a side surface facing the intermediate and upper gate patterns 158M and 158U. The vertical channel semiconductor layer 140 may pass through the gate patterns 158L, 158M, and 158U. When the memory vertical structure 146 further includes the semiconductor pattern 136, the semiconductor pattern 136 may pass through the lower gate pattern 158L, and the channel semiconductor layer 140 may pass through the intermediate and upper gate patterns 158M and 158U. The vertical channel semiconductor layer 140 may be formed of a polysilicon layer. An additional dielectric layer 155 may be between the lower gate pattern 158L and the semiconductor pattern 136.

In an exemplary embodiment, the semiconductor pattern 136 may be referred to as a channel semiconductor layer. For example, the semiconductor pattern 136 may be referred to as a lower vertical channel semiconductor layer positioned at a relatively lower portion, and the vertical channel semiconductor layer 140 may be referred to as an upper vertical channel semiconductor layer positioned at a relatively upper portion. Therefore, the semiconductor pattern 136, together with the vertical channel semiconductor layer 140 described above, may be referred to as a channel semiconductor layer.

The gate dielectric structure 138 may include a tunnel dielectric layer 138a, a data storage layer 138b, and a blocking dielectric layer 138c.

The data storage layer 138b may be disposed between the tunnel dielectric layer 138a and the blocking dielectric layer 138c. The data storage layer 138b may be disposed between the gate pattern 158 and the vertical channel semiconductor layer 140.

The blocking dielectric layer 138c may be disposed between the data storage layer 138b and the stacked structure 160. The tunnel dielectric layer 138a may be disposed between the data storage layer 138b and the vertical channel semiconductor layer 140. The tunnel dielectric layer 138a may include silicon oxide and/or impurity doped silicon oxide. The blocking dielectric layer 138c may include silicon oxide and/or a high-k dielectric. The data storage layer 138b may be formed of a material capable of storing data, for example, silicon nitride.

The data storage layer 138b may include regions capable of storing data between the vertical channel semiconductor layer 140 and the intermediate gate patterns 158M, which may be word lines (WL in FIGS. 1A and 1B). For example, electrons injected from the vertical channel semiconductor layer 140 through the tunnel dielectric layer 138a may be trapped and retained, or the trapped electrons in the data storage layer 138b may be erased, according to operating conditions of a non-volatile memory device such as a flash memory device.

Therefore, as described above, the data storage layer 138b positioned between the intermediate gate pattern 158M and the vertical channel semiconductor layer 140, which may be the word lines shown in FIG. 1B, may be defined as data storage areas, which may constitute the memory cells (MCT of FIG. 1B) as described with respect to FIG. 1B.

Referring to FIGS. 2B and 3 again, the lower structure 50 may be a semiconductor substrate, which may be formed of single crystal silicon. However, the inventive concepts are not limited thereto, and may be modified as illustrated in FIG. 7.

Figure 7:
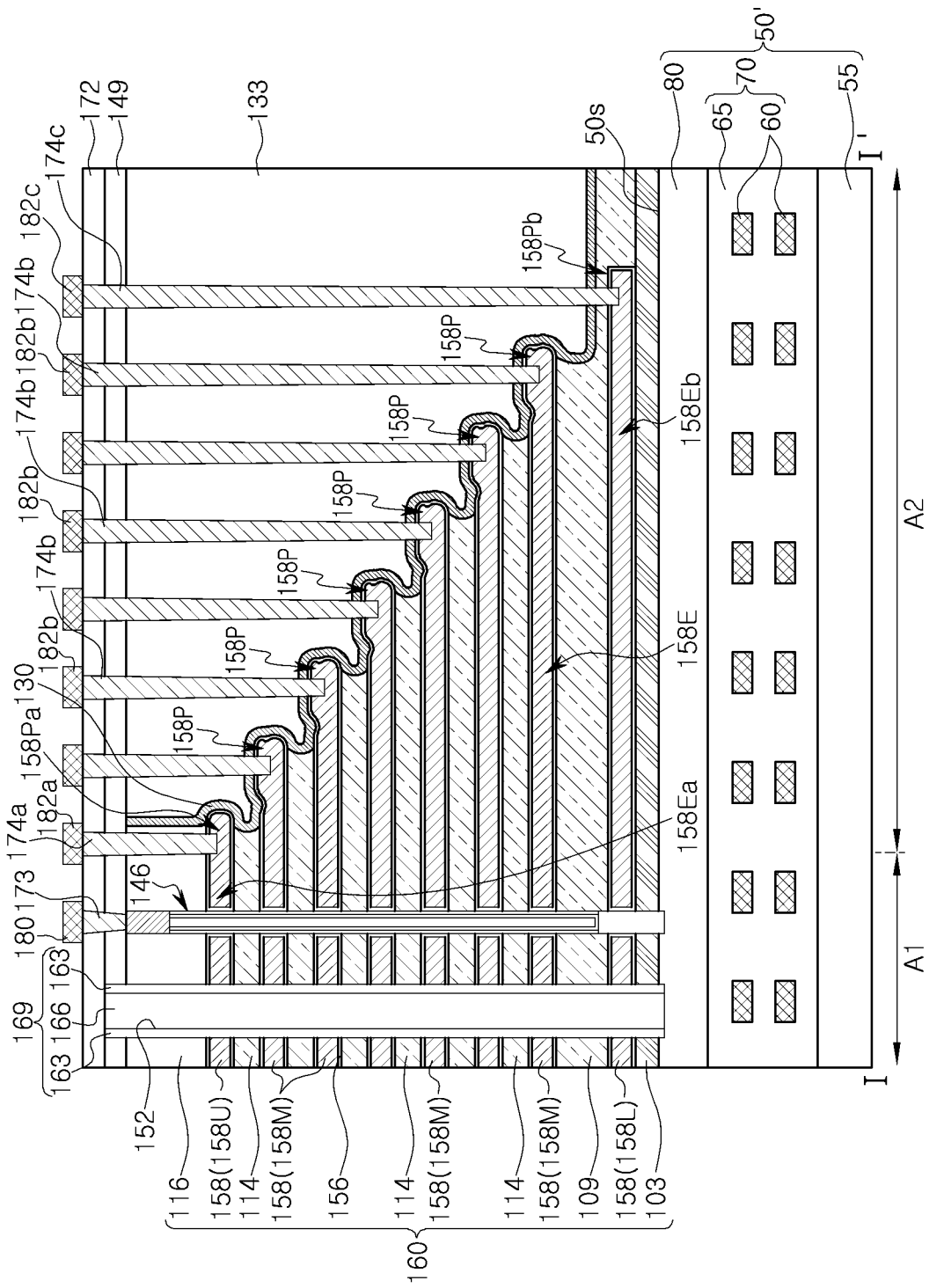
FIG. 7 illustrates a conceptual cross-sectional view of a semiconductor device according to a modified embodiment of the inventive concepts.

FIG. 7 illustrates a conceptual cross-sectional view of a semiconductor device according to a modified embodiment of the inventive concepts.

In the modified embodiment as shown in FIG. 7, the lower structure 50 as illustrated in FIG. 2B may be modified in FIG. 7 into a lower structure 50' including a first substrate 55, a peripheral circuit structure 70 on the first substrate 55, and a second substrate 80 on the peripheral circuit structure 70. For example, the first substrate 55 may be a semiconductor substrate that may be formed of monocrystalline silicon, and the second substrate 80 may be a semiconductor substrate that may be formed of polysilicon. The peripheral circuit structure 70 may include a peripheral circuit wiring line 60 and a lower insulation layer 65 covering the peripheral circuit wiring line 60.

Referring to FIGS. 2A, 2B and 3 again, as described above, in the lower gate pattern 158L, the lower gate pad region 158Pb may be substantially the same thickness as the lower gate electrode region 158Eb, and in the upper gate pattern 158U, the upper gate pad region 158Pa may be substantially the same thickness as the upper gate electrode region 158Ea. However, the inventive concepts are not limited thereto, and may be modified as illustrated in FIG. 8.

Figure 8:
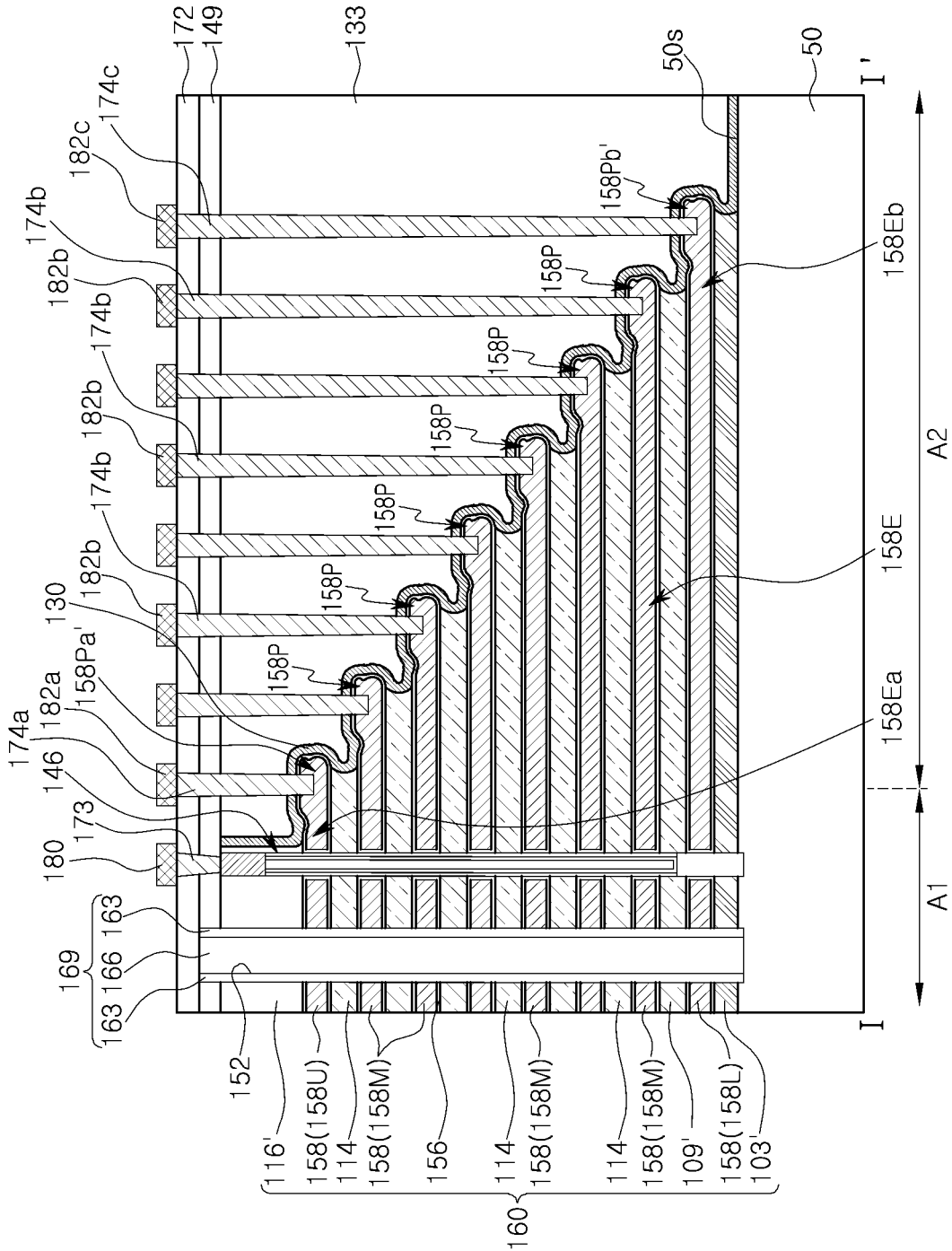
FIG. 8 illustrates a conceptual cross-sectional view of a semiconductor device according to a modified embodiment of the inventive concepts.

FIG. 8 illustrates a conceptual cross-sectional view of a semiconductor device according to a modified embodiment of the inventive concepts.

In the modified embodiment as shown in FIG. 8, in the lower gate pattern 158L the lower gate pad region 158Pb' may include a pad region having a thickness greater than a thickness of the lower gate electrode region 158Eb, and in the upper gate pattern 158U the upper gate pad region 158Pa' may include a pad region having a thickness greater than a thickness of the upper gate electrode region 158Ea. The lower gate pad region 158Pb' and the upper gate pad region 158Pa' may have the same thickness or the same structure as the intermediate gate pad regions 158P described previously with respect to FIGS. 4A-4E.

In the stacked structure 160 of FIG. 8, the lower interlayer insulation layer 109 such as shown in FIG. 2B may be modified into a lower interlayer insulation layer 109' having the same thickness as that of each of the intermediate interlayer insulation layers 114, and the upper insulation layer 116 such as shown in FIG. 2B may be modified into an upper insulation layer 116' exposing the upper gate pad region 158Pa'. Also in FIG. 8, the lowermost interlayer insulation layer 103 such as shown in FIG. 2B may be modified into a lowermost interlayer insulation layer 103' exposing the upper surface 50s of the lower structure 50.

Referring to FIGS. 2A, 2B and 3 again, the gate pad regions 158Pa, 158P, and 158Pb may be arranged in a stepped shape in which they are sequentially lowered in any one direction in the second area A2. As described above, the gate pad regions 158Pa, 158P, and 158Pb are not limited to the stepped shapes illustrated in FIG. 2B, but may be modified into various shapes. An exemplary embodiment of a stepped shape that may be modified into various shapes as described above will be described with reference to FIGS. 9 to 12.

Figure 9:
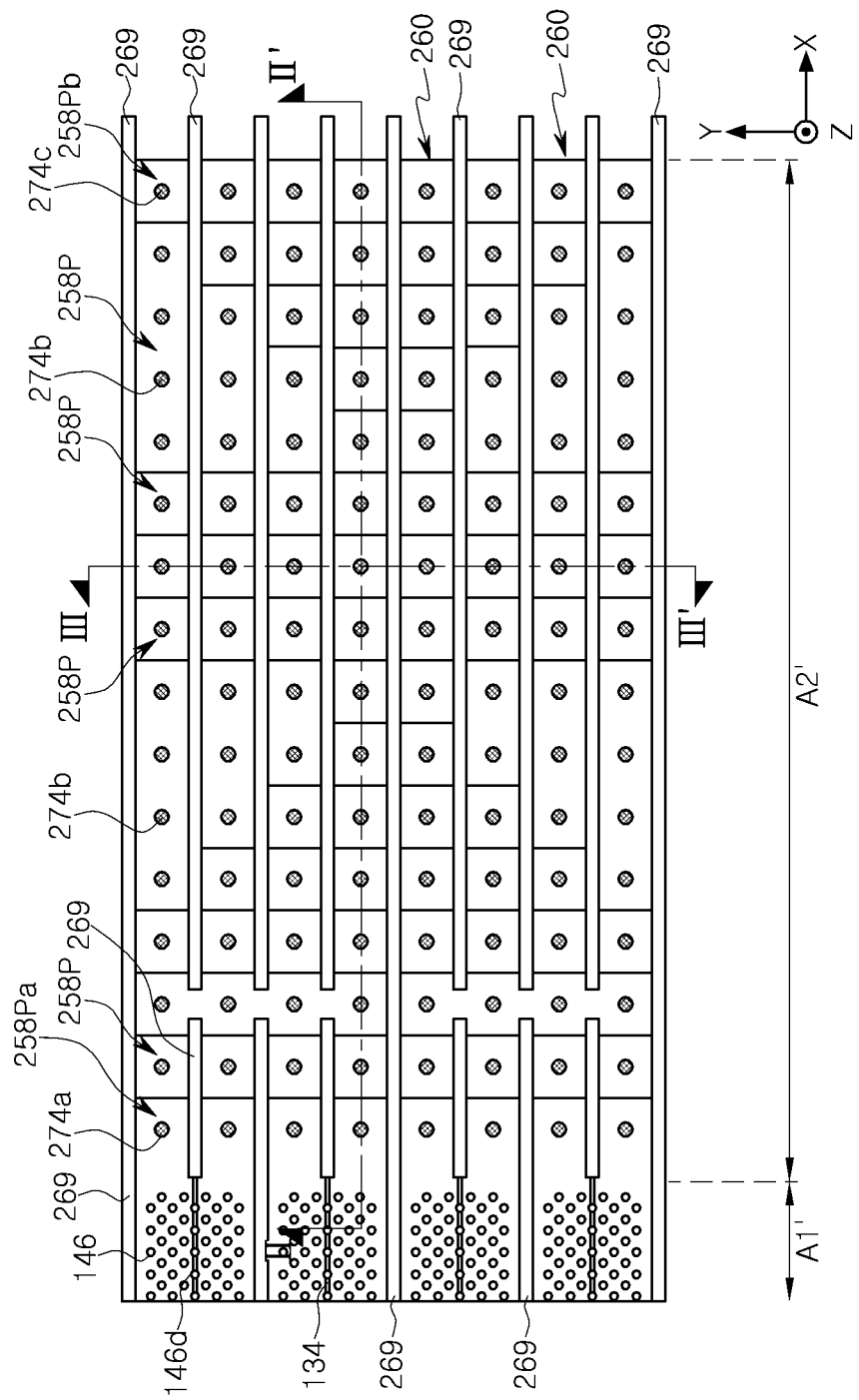
FIG. 9 illustrates a plan view of a semiconductor device according to a modified embodiment of the inventive concepts.
Figure 10:
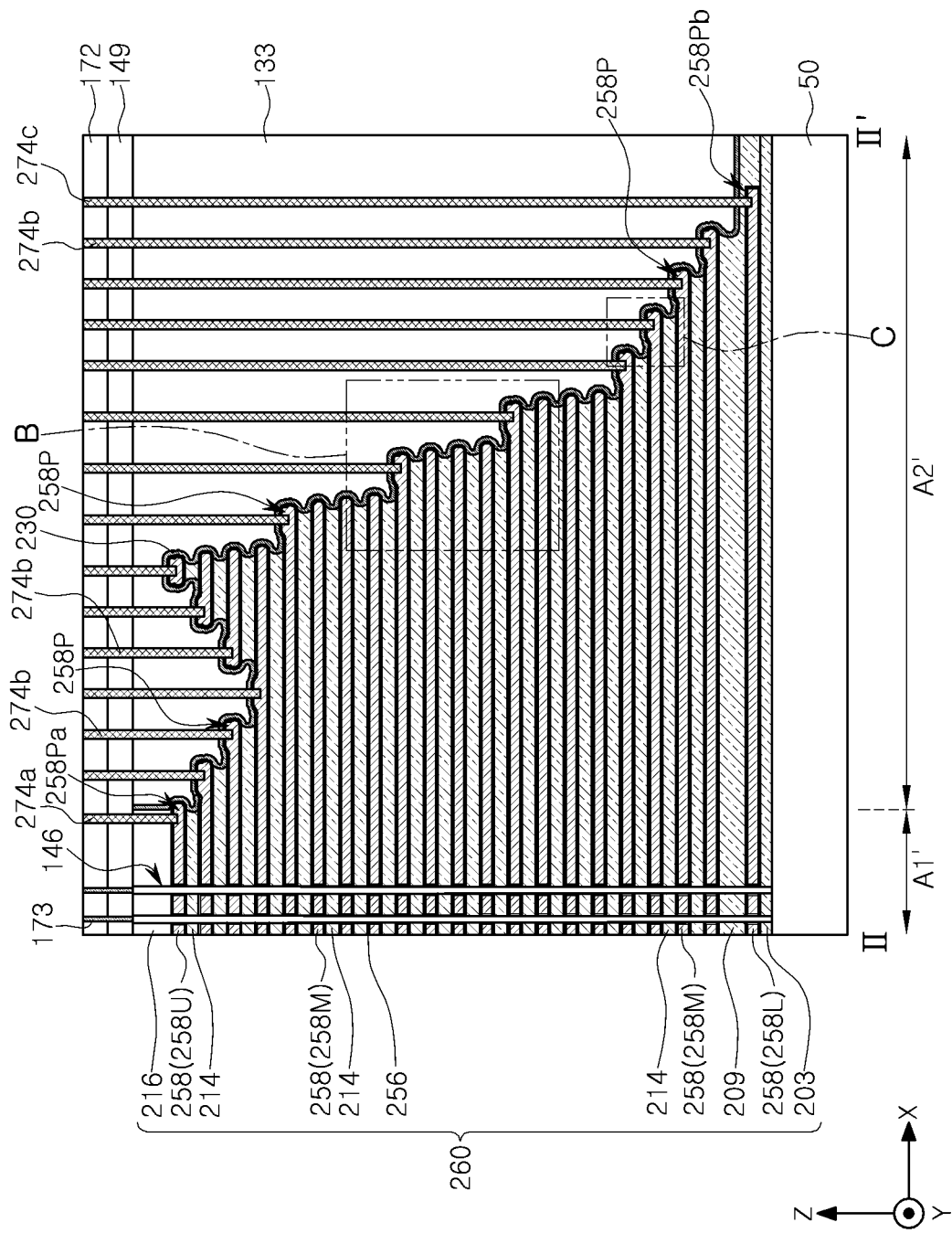
FIG. 10 illustrates a cross-sectional view of a region taken along a line II-II' in FIG. 9.
Figure 11:
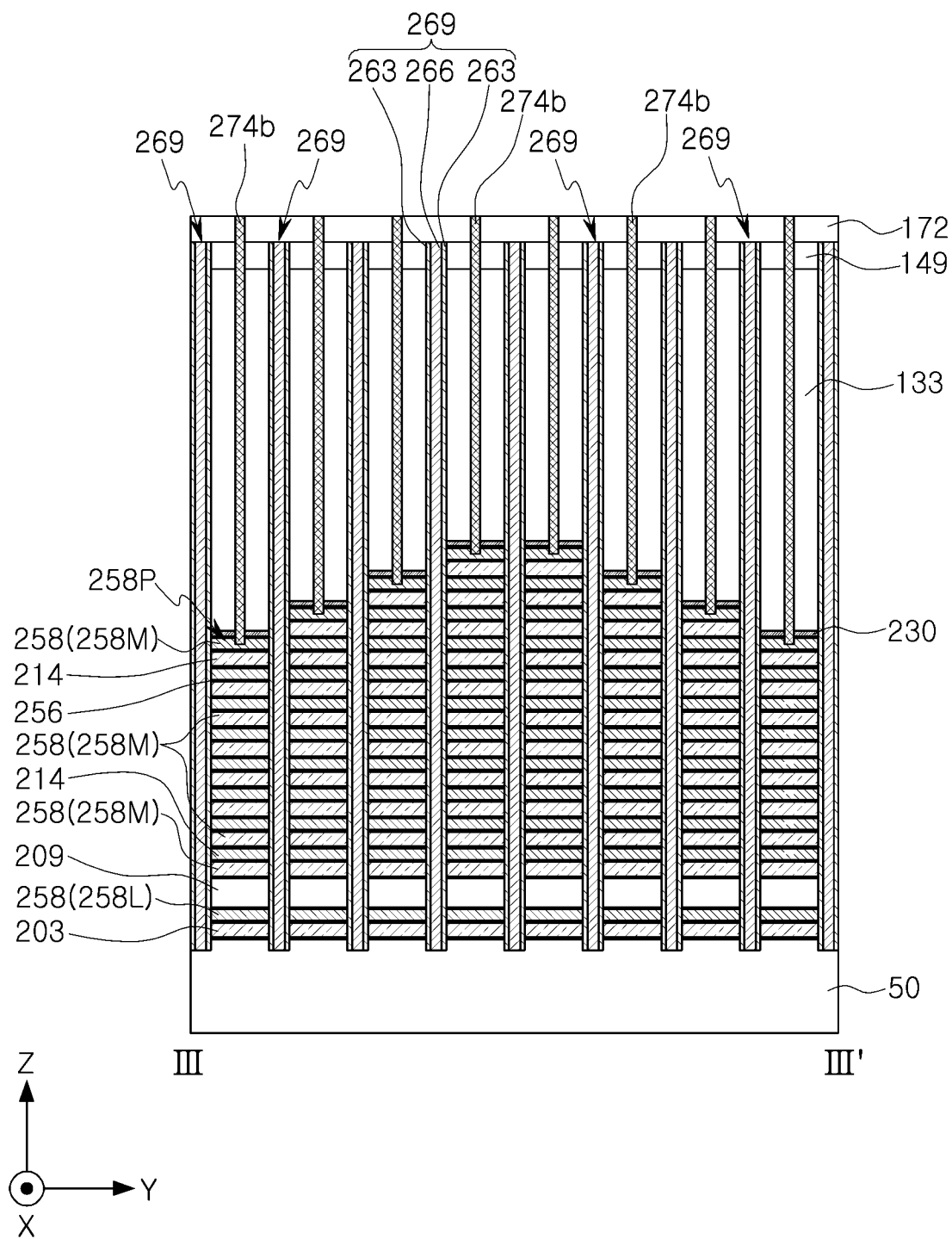
FIG. 11 illustrates a cross-sectional view of a region taken along a line III-III' in FIG. 9.
Figure 12:
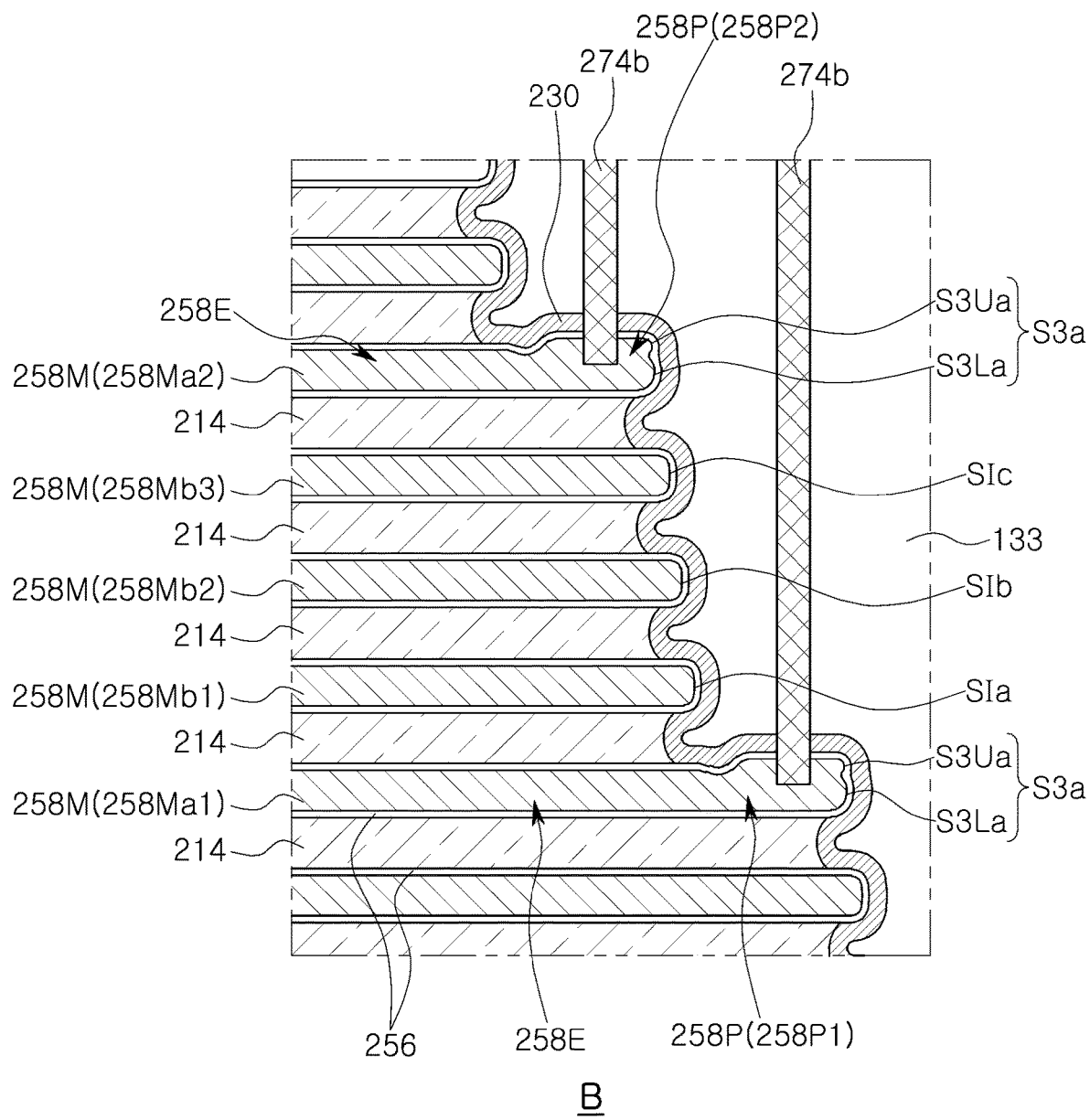
FIG. 12 illustrates a partially enlarged view of an embodiment of portion 'B' in FIG. 10.

FIGS. 9, 10, 11, and 12 illustrate views of a semiconductor device according to a modified embodiment of the inventive concepts. FIG. 9 illustrates a plan view of a semiconductor device according to an embodiment of the inventive concepts. FIG. 10 illustrates a cross-sectional view of a region taken along a line II-II' in FIG. 9. FIG. 11 illustrates a cross-sectional view of a region taken along a line III-III' in FIG. 9. FIG. 12 illustrates a partially enlarged view of an embodiment of portion 'B' in FIG. 10. In FIG. 10, a portion denoted by 'C' may have substantially the same structure and the same shape as the portion denoted by 'A' in FIG. 3. FIG. 3 illustrating an enlarged portion indicated by 'A' in FIG. 2B may correspond to portion 'C' in FIG. 10. Therefore, although there is no description about the portion denoted by 'C' in FIG. 10, the portion denoted by 'C' in FIG. 10 can be understood as corresponding to FIG. 3.

Referring to FIGS. 9 to 12, a stacked structure 260 may be disposed on the lower structure 50 as described previously. The stacked structure 260 may include a plurality of gate patterns 258.

The plurality of gate patterns 258 may be stacked while being spaced apart from each other in a vertical direction Z in a first area A1' on the lower structure 50, and may extend into a second area A2' on the lower structure 50. The plurality of gate patterns 258 may extend in a first horizontal direction X perpendicular to the vertical direction Z, and may extend into a second area A2' on the lower structure 50.

In embodiments, the vertical direction Z may be perpendicular to the upper surface of the lower structure 50. The first horizontal direction X may be parallel to the upper surface of the lower structure 50.

The plurality of gate patterns 258 may include a lower gate pattern 258L, intermediate gate patterns 258M on (or over) the lower gate pattern 258L, and an upper gate pattern 258U on (or over) the intermediate gate patterns 258M.

The plurality of gate patterns 258 may include gate electrode regions, and gate pad regions 258Pa, 258P, and 258Pb extending from the gate electrode regions. The gate pad regions 258Pa, 258P, and 258Pb may be arranged in a stepped shape in the second area A2'. For example, the gate pad regions 258Pa, 258P, and 258Pb may be stepped shapes having a plan view as illustrated in FIG. 9 and cross-sectional views as illustrated in FIGS. 10 and 11. For example, when shown in a cross-sectional view as illustrated in FIG. 10, the stepped shapes of the gate pad regions 258Pa, 258P, and 258Pb may include stepped portions that may be lowered by a one gate pattern height, stepped portions that may increase by a one gate pattern height, and stepped portions that may be lowered by a four gate patterns height, in the first horizontal direction X. When shown in a cross-sectional view on any one stepped height as illustrated in FIG. 11, i.e., in a second horizontal direction Y perpendicular to the first horizontal direction X, the stepped shapes of the gate pad regions 258Pa, 258P, and 258Pb may be shapes including stepped portions that may be lowered by a one gate pattern height on both sides. The inventive concepts are not limited to the above-described stepped shapes of the gate pad regions 258Pa, 258P, and 258Pb, and may include all the stepped shapes that may be modified into various shapes.

In a similar manner to those described in FIG. 2B, the lower gate pattern 258L may include the lower gate pad region 258Pb not overlapping with the intermediate gate patterns 258M in the vertical direction Z. In addition, each of the intermediate gate patterns 258M may include the intermediate gate pad regions 258P not overlapping with a gate pattern positioned at a relatively upper portion of the gate patterns 258 in the vertical direction Z. The upper gate pattern 258U may include an upper gate pad region 258Pa positioned within the second area A2'.

The first area A1' may be the memory array area (MA in FIGS. 1A and 1B) described in FIGS. 1A and 1B, or an area in which the memory array area (MA in FIGS. 1A and 1B) may be positioned. The second area A2' may be an area in which the gate pad regions 258Pa, 258P, and 258Pb may be positioned.

The stacked structure 260 may include interlayer insulation layers alternately and repeatedly stacked with the gate patterns 258. For example, the interlayer insulation layers may include a lowermost interlayer insulation layer 203, a lower interlayer insulation layer 209, intermediate interlayer insulation layers 214, and an upper interlayer insulation layer 216. The interlayer insulation layers may be formed of silicon oxide for example.

The lowermost interlayer insulation layer 203 may be disposed on (or over) the lower structure 50, and may be disposed in a position lower than a position of the lower gate pattern 258L. The lower interlayer insulation layer 209 may be disposed on the lowermost interlayer insulation layer 203, may cover the lower gate pattern 258L, and may be disposed in a position lower than a position of a lowermost intermediate gate pattern among the intermediate gate patterns 258M. Each of the intermediate interlayer insulation layers 214 may be disposed between two gate patterns spaced apart from each other in the vertical direction Z among the intermediate and upper gate patterns 258M and 258U positioned in a position higher than a position of the lower gate pattern 258L. The upper interlayer insulation layer 216 may be disposed on the upper gate pattern 258U.

A first capping insulation layer 133 may be disposed to cover the lower and intermediate gate pad regions 258Pb and 258P. The first capping insulation layer 133 may have an upper surface coplanar with the upper interlayer insulation layer 216.

In an exemplary embodiment, an insulation liner 230 may be disposed to cover the intermediate gate pad regions 258P and extend between the upper interlayer insulation layer 216 and the first capping insulation layer 133. The insulation liner 230 may be formed of silicon oxide for example.

A memory vertical structure 146 may be disposed pass through the stacked structure 260. The memory vertical structure 146 may be the same as described with reference to FIG. 6. The dielectric layer 256 may cover an upper surface and lower surface of each of the gate patterns 258, may extend to a surface of each of the gate patterns 258 facing the memory vertical structure 146, and may extend to an outer side surface of each of the gate patterns 258. A portion of the dielectric layer 256 may be between the insulation liner 230 and each of the upper and the intermediate gate patterns 258U and 258M.

A second capping insulation layer 149 may be arranged cover the stacked structure 260 and the first capping insulation layer 133, and a third capping insulation layer 172 may be arranged on the second capping insulation layer 149.

Separation structures 269 (see FIGS. 9 and 11) may be disposed in trenches passing through the stacked structure 260 and the second capping insulation layer 149. The separation structure 269 may include a separation pattern 266, and a separation spacer 263 on a side surface of the separation pattern 266. In an exemplary embodiment, the separation pattern 266 may be formed of a conductive material, and the separation spacers 263 may be formed of an insulating material.

A bit line contact plug 173 passing through the second and third capping insulation layers 149 and 172 may be disposed on the memory vertical structure 146. An upper gate contact plug 274a passing through the upper interlayer insulation layer 216 and the second and third capping insulation layers 149 and 172 may be disposed on the upper gate pad region 258Pa. Intermediate gate contact plugs 274b passing through the first to third capping insulation layers 133, 149, and 172 may be disposed on the intermediate gate pad regions 258P. A lower gate contact plug 274c passing through the first to third capping insulation layers 133, 149, and 172 may be disposed on the lower gate pad regions 258Pb. A dielectric layer 256 may be disposed on the gate patterns 258.

Next, the description will be mainly based on the cross-sectional view of FIG. 12. Referring to FIG. 12, together with FIGS. 9 to 11, the intermediate gate patterns 258M may include a first gate pattern 258Ma1, a second gate pattern 258Ma2 over the first gate pattern 258Ma1, and one or more third gate patterns 258Mb1, 258Mb2, and 258Mb3 between the first and second gate patterns 258Ma1 and 258Ma2. The first and second gate patterns 258Ma1 and 258Ma2 may include gate pad regions 258P including a region having an increased thickness. Hereinafter, a case in which the one or more third gate patterns 258Mb1, 258Mb2, and 258Mb3 are provided will be mainly described.

The first gate pattern 258Ma1 may include a gate electrode region 258E overlapping with the third gate patterns 258Mb1, 258Mb2, and 258Mb3 positioned at a relatively higher portion, and a first gate pad region 258P1 not overlapping with the third gate patterns 258Mb1, 258Mb2, and 258Mb3 and extending from the gate electrode region 258E in a first horizontal direction X. The second gate pattern 258Ma2 may include a gate electrode region 258E overlapping with gate patterns positioned at a relatively higher portion, and a second gate pad region 258P2 not overlapping with gate patterns positioned at a relatively higher portion and extending from the gate electrode region 258E in a first horizontal direction X.

The third gate patterns 258Mb1, 258Mb2, and 258Mb3 arranged in the first horizontal direction X do not include any one of gate pad regions between the first and second gate pad regions 258P1 and 258P2. Therefore, each of the third gate patterns 258Mb1, 258Mb2, and 258Mb3 may have the same thickness as the gate electrode region 258E between the first and second gate pad regions 258P1 and 258P2. The gate pad regions (258P in FIG. 11) of the third gate patterns 258Mb1, 258Mb2, and 258Mb3 may be formed by extending from the gate electrode regions overlapping with the gate pattern positioned at a relatively upper portion in a second horizontal direction Y. The first and second horizontal directions X and Y may be parallel to the upper surface of the lower structure 50, and may be perpendicular to each other.

Outer side surfaces SIa, SIb, and SIc of the third gate patterns 258Mb1, 258Mb2, and 258Mb3 positioned in the first horizontal direction X may be formed by extending from lower surfaces of the third gate patterns 258Mb1, 258Mb2, and 258Mb3 in (or with) a rounded shape. That is, a connecting portion of the lower surface of the third gate pattern 258Mb1 and the outer side surface SIa has a rounded shape, a connecting portion of the lower surface of the third gate pattern 258Mb2 and the outer side surface SIb has a rounded shape, and a connecting portion of the lower surface of the third gate pattern 258Mb3 and the outer side surface SIc has a rounded shape. For example, the outer side surfaces SIa, SIb, and SIc of the third gate patterns 258Mb1, 258Mb2, and 258Mb3 positioned in the first horizontal direction X may have a convex shape. The outer side surfaces SIa, SIb, and SIc of the third gate patterns 258Mb1, 258Mb2, and 258Mb3 may have a more convex shape than an outer side surface of a lowermost gate pattern (258L in FIG. 10) among the gate patterns 258.

Each of the first and second gate pad regions 258P1 and 258P2 may include an outer side surface S3a having a lower outer side surface S3La and an upper outer side surface S3Ua. The outer side surface S3a of each of the first and second gate pad regions 258P1 and 258P2 may have the same shape as any one of the outer side surfaces S3a, S3b, S3c, and S3d, described with reference to FIGS. 4A to 4E. Therefore, since each of the first and second gate pad regions 258P1 and 258P2 may have the same shape as any one of the gate pad regions 158P described with reference to FIGS. 4A to 4E, a detailed description of the shapes of the first and second gate pad regions 258P1 and 258P2 will be omitted.

In the third gate patterns 258Mb1, 258Mb2, and 258Mb3, a gate pattern positioned in a relatively lower portion may be formed to further extend in the horizontal direction than a gate pattern positioned in a relatively higher portion.

In the embodiments described above, the outer side surface of the one or more gate pad regions may be convex in a hemispherical shape. The inventive concepts are not limited thereto. Modified embodiments of the outer side surface of the one or more gate pad regions will be described with reference to FIGS. 13 and 14A.

Figure 13:
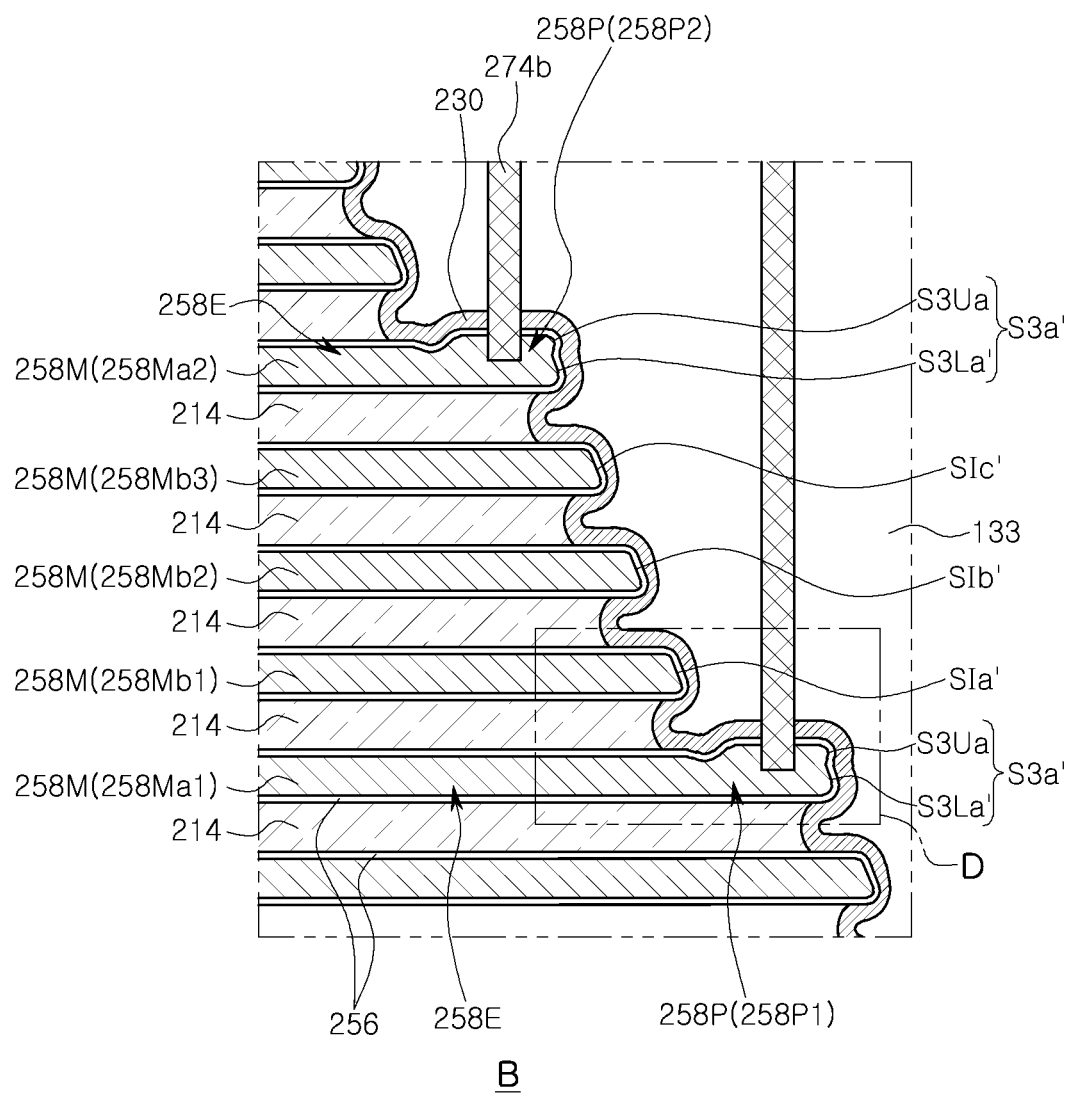
FIG. 13 illustrates a partially enlarged view of a modified embodiment of portion 'B' in FIG. 10.

FIG. 13 illustrates a partially enlarged view of a modified embodiment of portion 'B' in FIG. 10. FIGS. 14A to 14D illustrate partially enlarged views of modified embodiments of portion 'D' in FIG. 13.

Figure 14A:
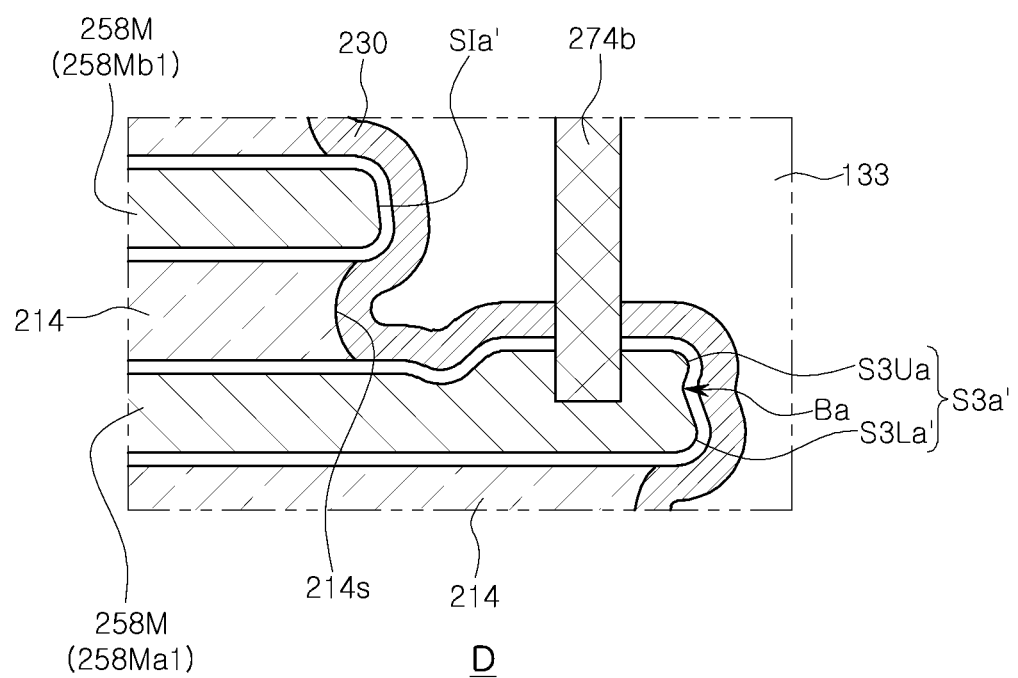
FIGS. 14A, 14B, 14C and 14D illustrate partially enlarged views of modified embodiments of portion 'D' in FIG. 13.

Referring to FIGS. 13 and 14A, each of outer side surfaces SIa', SIb', and SIc' of the third gate patterns 258Mb1, 258Mb2, and 258Mb3 may be formed such that a relatively lower portion protrudes further in a lateral direction than a relatively upper portion.

The outer side surface S3a' of each of the first and second gate pad regions 258P1 and 258P2 may include a lower outer side surface S3La' and an upper outer side surface S3Ua.

The upper outer side surface S3Ua may have the same shape as the upper outer side surface S3Ua of the outer side surface S3a described with reference to FIG. 4A. The lower outer side surface S3La' may have a shape modified such that a relatively lower portion protrudes further in a lateral direction than a relatively upper portion, compared to the lower outer side surface (S3L in FIG. 4A) of the outer side surface S3a described with reference to FIG. 4A.

The gate pad region 258P1 of the first gate pattern 258Ma1 has a shape modified such that a relatively lower portion protrudes further in a lateral direction than a relatively upper portion, compared to the lower region (T2L in FIG. 4A) of the gate pad region (158P in FIG. 4A) described with reference to FIG. 4A.

Figure 14B:
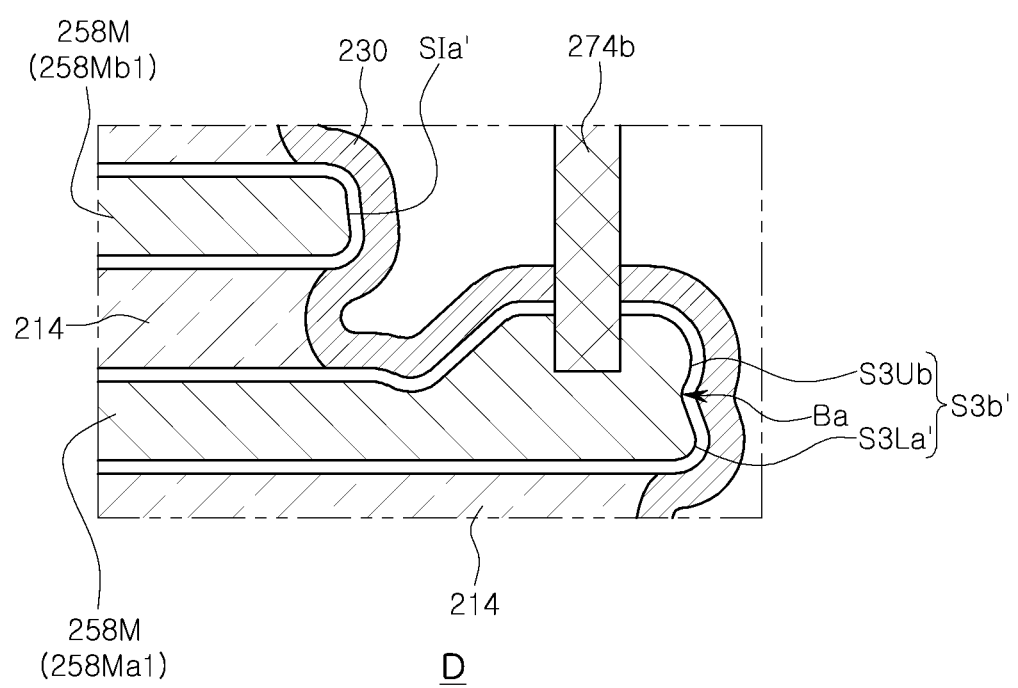
Figure 14C:
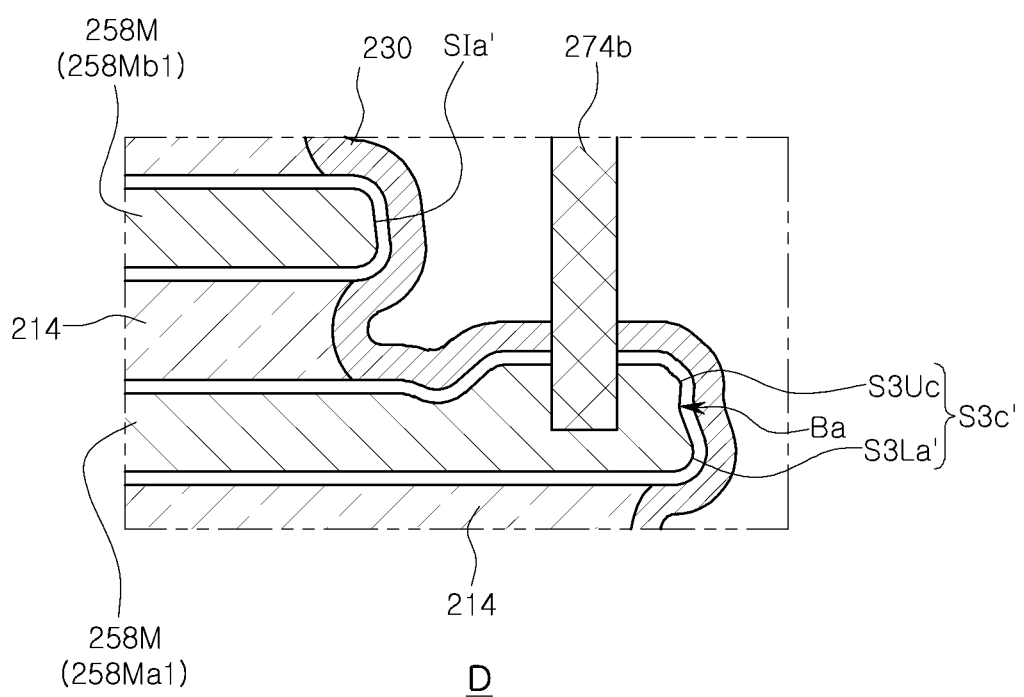
Figure 14D:
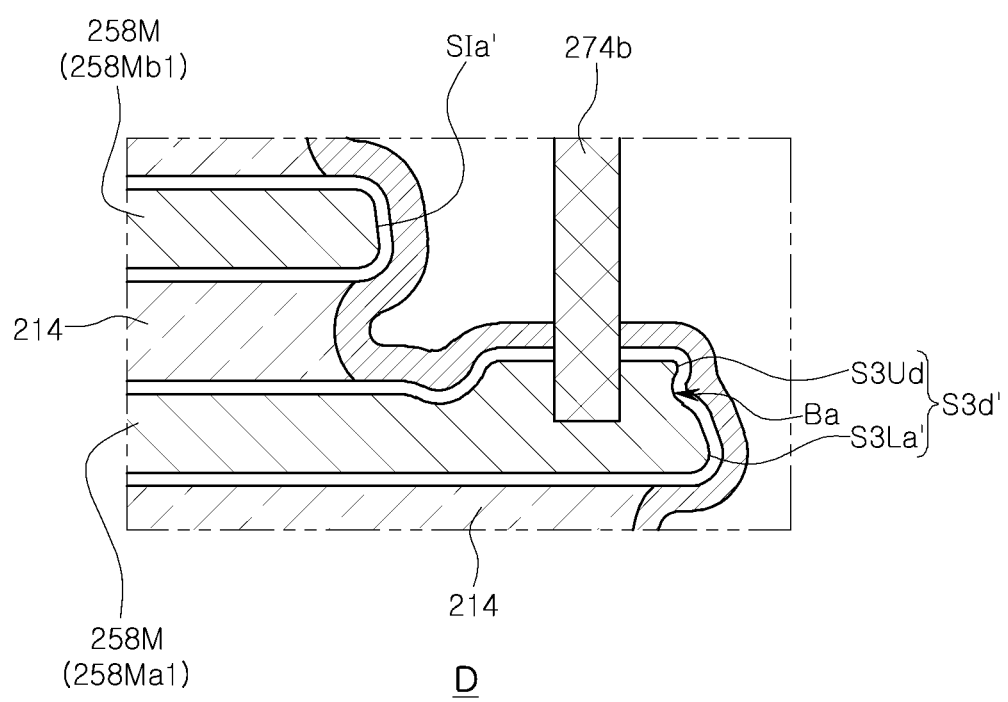

In a similar manner, the gate pad region 258P1 of the first gate pattern 258Ma1 may be variously modified as illustrated in FIGS. 14B, 14C, and 14D.

In a modified embodiment, referring to FIG. 14B, the gate pad region 258P1 of the first gate pattern 258Ma1 has a shape modified such that a relatively lower portion protrudes further in a lateral direction than a relatively upper portion, compared to the lower region (T2L in FIG. 4C) in the gate pad region (158P in FIG. 4C) described with reference to FIG. 4C.

In a modified embodiment, referring to FIG. 14C, the gate pad region 258P1 of the first gate pattern 258Ma1 have a shape modified such that a relatively lower portion protrudes further in a lateral direction than a relatively upper portion, compared to the lower region (T2L in FIG. 4D) in the gate pad region (158P in FIG. 4D) described with reference to FIG. 4D.

In a modified embodiment, referring to FIG. 14D, the gate pad region 258P1 of the first gate pattern 258Ma1 have a shape modified such that a relatively lower portion protrudes further in a lateral direction than a relatively upper portion, compared to the lower region (T2L in FIG. 4E) in the gate pad region (158P in FIG. 4E) described with reference to FIG. 4E.

Next, a method of forming a semiconductor device according to an embodiment of the inventive concepts will be described with reference to FIGS. 15 to 21. FIGS. 15 to 21 illustrate cross-sectional views of a method of forming a semiconductor device according to an embodiment of the inventive concepts.

Figure 15:
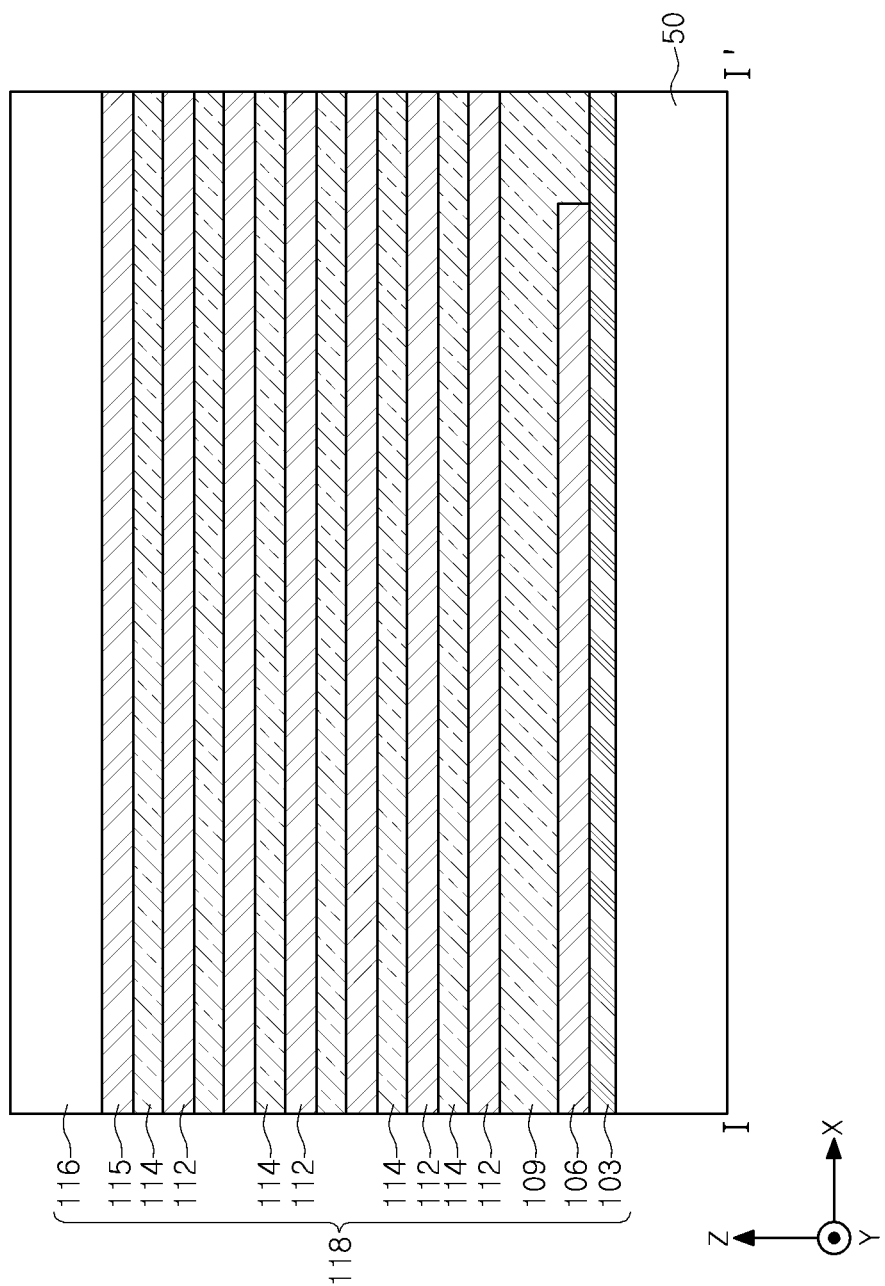
FIGS. 15, 16, 17, 18, 19, 20 and 21 illustrates cross-sectional views of a method of forming a semiconductor device according to an embodiment of the inventive concepts.

Referring to FIG. 15, a molded structure 118 is formed on a lower structure 50. A formation of the molded structure 118 may include forming a lowermost interlayer insulation layer 103 on the lower structure 50, forming a patterned lower mold layer 106 on the lowermost interlayer insulation layer 103, forming a lower interlayer insulation layer 109 on the lower mold layer 106, forming intermediate mold layers 112 and intermediate interlayer insulation layers 114 alternately and repeatedly on the lower interlayer insulation layer 109, forming an upper mold layer 115 on an uppermost intermediate interlayer insulation layer 114 among the intermediate interlayer insulation layers 114, and forming an upper interlayer insulation layer 116 on the upper mold layer 115. The lower mold layer 106, the intermediate mold layers 112, and the upper mold layer 115 may be formed of silicon nitride for example, and the interlayer insulation layers 103, 109, 114, and 116 may be formed of silicon oxide for example.

Figure 16:
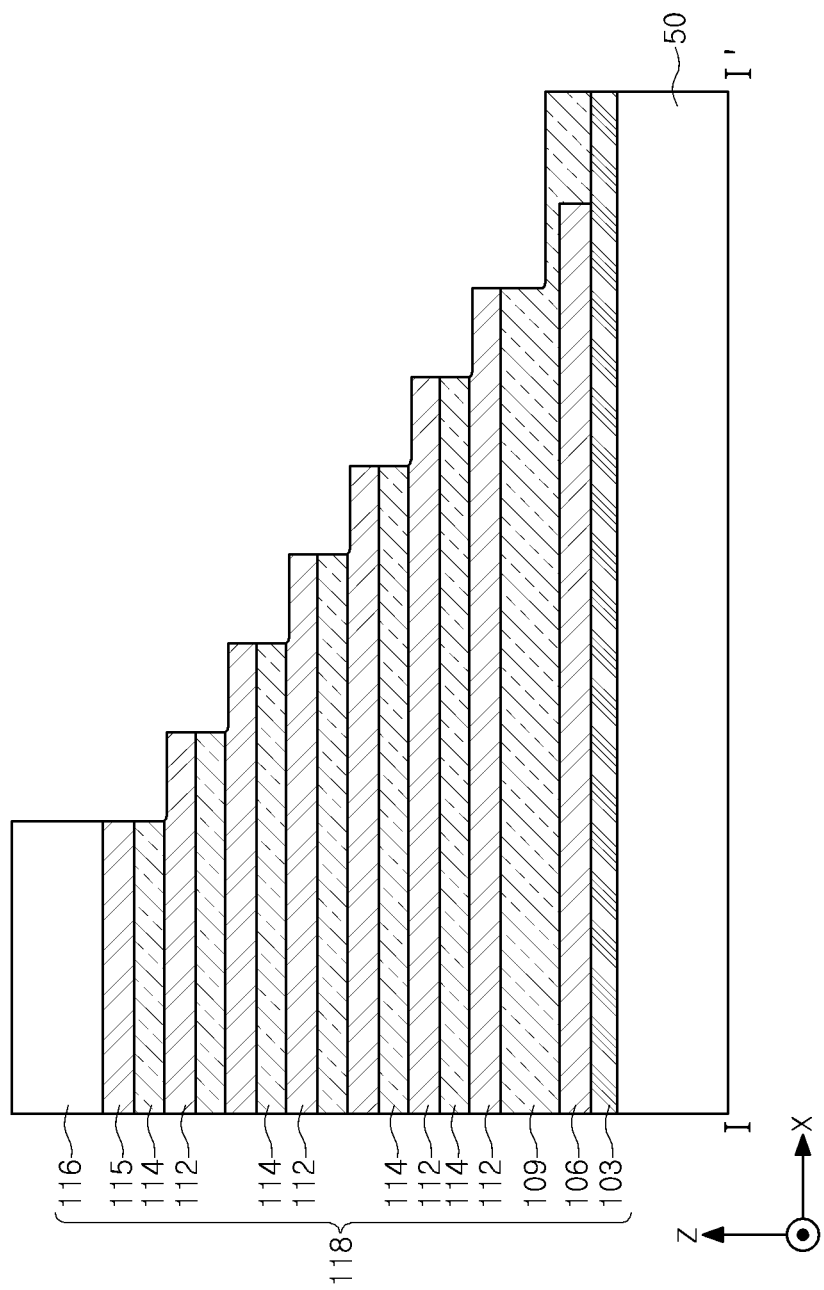

Referring to FIG. 16, the intermediate and upper mold layers 112 and 115 are patterned to form stepped shapes. The upper mold layer 115 may be covered with the patterned upper interlayer insulation layer 116, and end portions of the intermediate mold layers 112 may be exposed.

In an exemplary embodiment, in the intermediate mold layers 112, the end portions may be recessed relative to the remaining portions.

Figure 17:
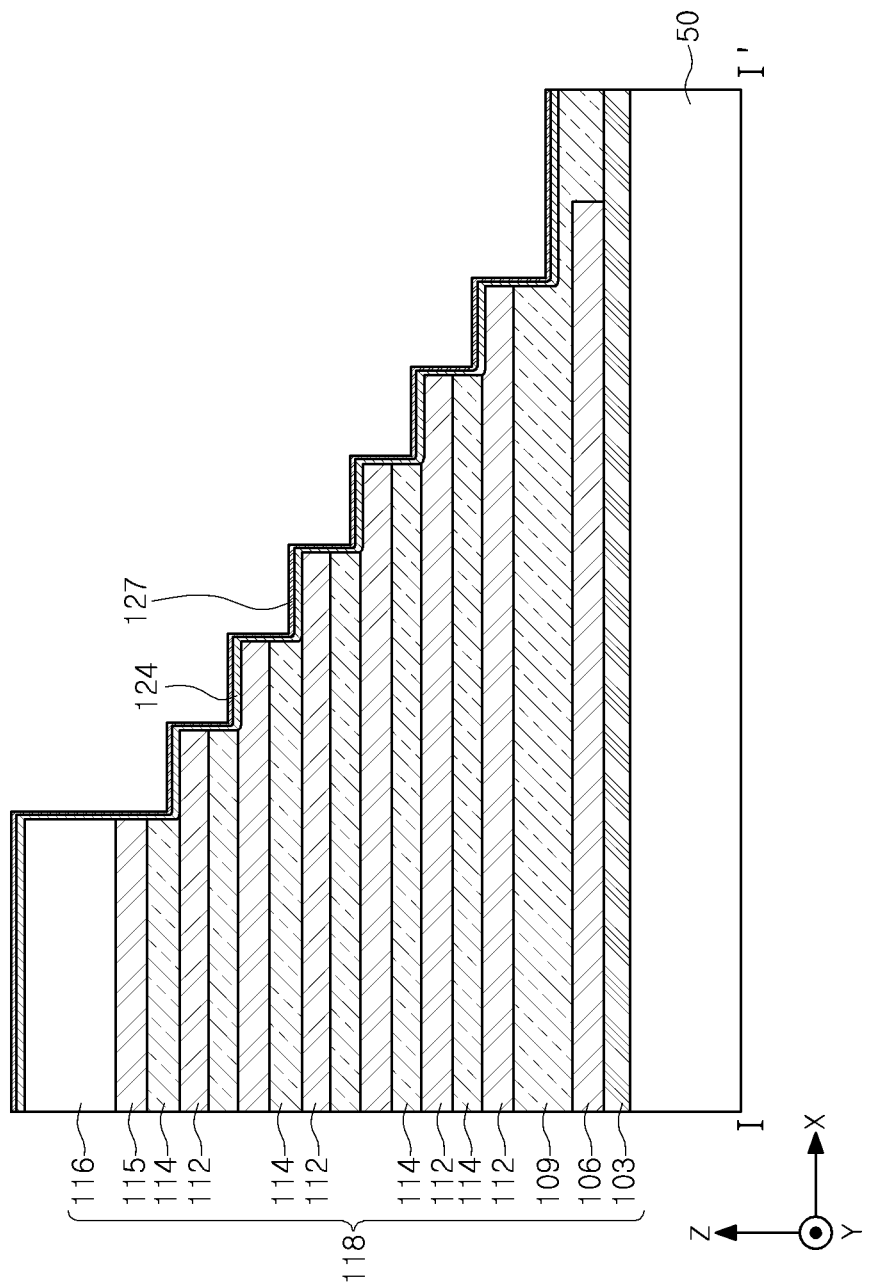

Referring to FIG. 17, one or more pad mold layers are formed. For example, a first pad mold layer 124 and a second pad mold layer 127 may be formed in sequence.

The first and second pad mold layers 124 and 127 may be formed of materials having an etch selectivity with the interlayer insulation layers 103, 109, 114, and 116.

The first and second pad mold layers 124 and 127 may be formed of a material having an etch selectivity with respect to each other. For example, the first and second pad mold layers 124 and 127 may be formed of different materials, or may for example be formed of nitride-based materials having different densification levels from each other.

The first and second pad mold layers 124 and 127 may be formed such that portions thereof parallel to an upper surface of the lower structure 50 are thicker than portions thereof perpendicular to an upper surface of the lower structure 50.

Figure 18:
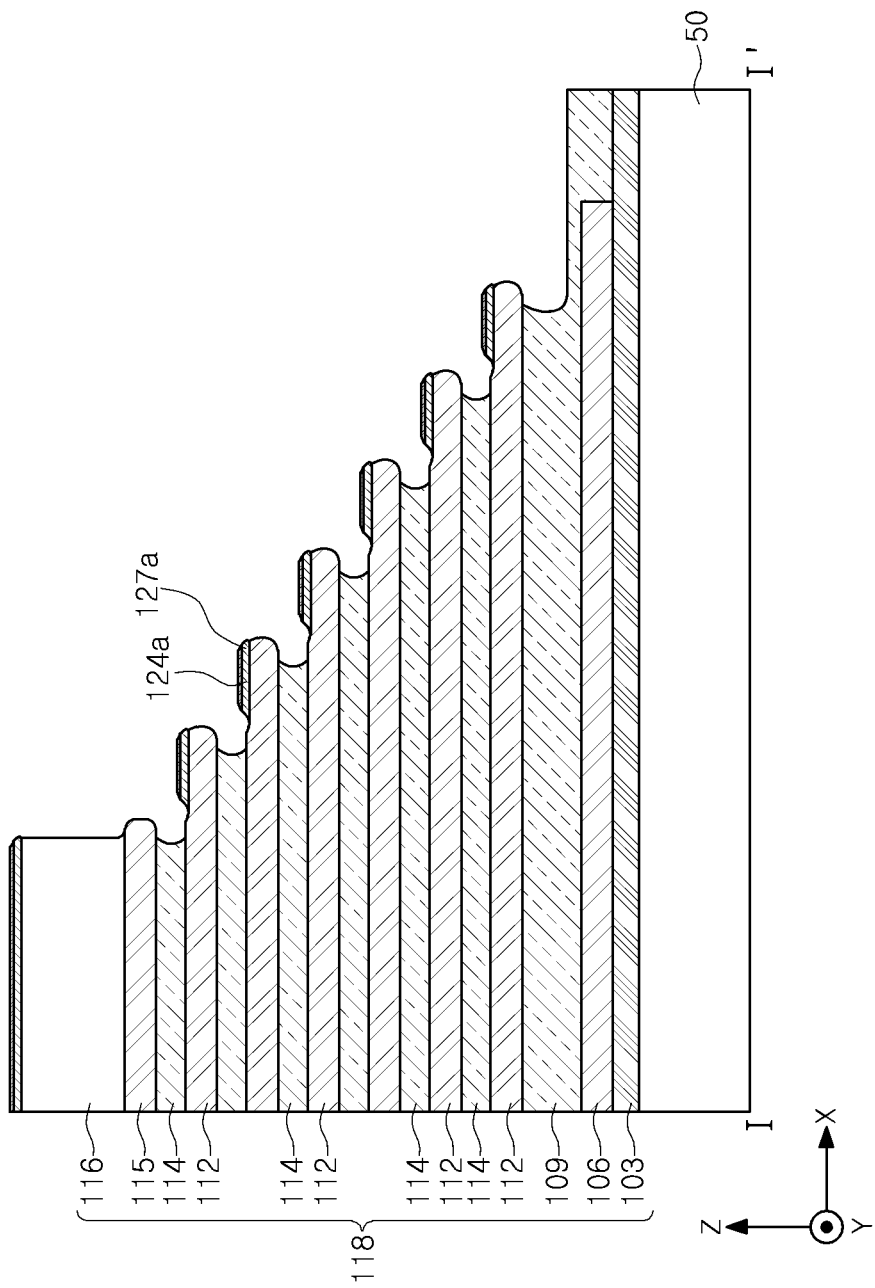

Referring to FIG. 18, the first and second pad mold layers 124 and 127 are etched to form first and second pad mold layers 124a and 127a remaining on end portions of the intermediate mold layers 112.

The portions of the first and second pad mold layers 124 and 127 that are parallel to the upper surface of the lower structure 50 are thicker than the portions of the first and second pad mold layers 124 and 127 perpendicular to the upper surface of the lower structure 50, as described above. In the first and second pad mold layers 124 and 127, relatively thin portions perpendicular to the upper surface of the lower structure 50 may be removed, and relatively thick portions parallel to the upper surface of the lower structure 50 may remain. Depending on a shape of the remaining first and second pad mold layers 124a and 127a, the shape of the gate pad region 158P as illustrated in FIGS. 4A to 4E may be formed.

In embodiments, interlayer insulation layers 103, 109, 114 and 116 may be partially etched and recessed, and edges of side surfaces of exposed intermediate and upper mold layers 112 and 115 may be etched to form outer side surfaces of the intermediate and upper mold layers 112 and 115 in (or as having) rounded shape as previously described.

Pad mold layers 124 and 127 positioned on the lower insulation layer 109 (see FIG. 17) may be removed by the photo and etching processes used to form remaining first and second pad mold layers 124a and 127a.

Figure 19:
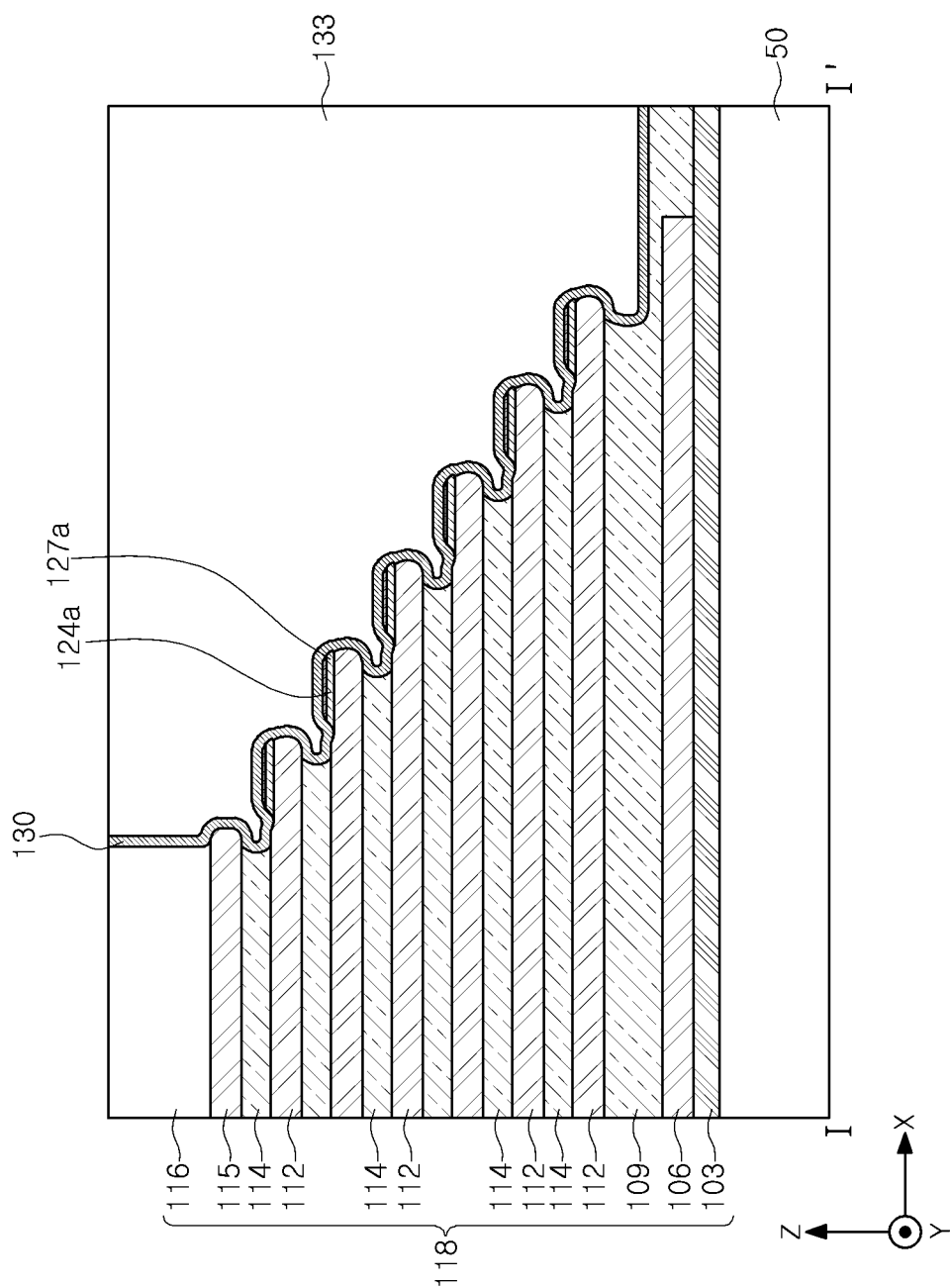

Referring to FIG. 19, an insulation liner 130 is conformally formed on the formed structures as described above. The insulation liner 130 may be formed of silicon oxide for example.

Thereafter, an insulating material is deposited on the structure including insulation liner 130, and a planarization process is then performed until the upper interlayer insulation layer 116 is exposed. The insulating material remaining on the insulation liner 130 after the planarization process is first capping insulation layer 133. The first capping insulation layer 133 may be formed of silicon oxide for example.

Figure 20:
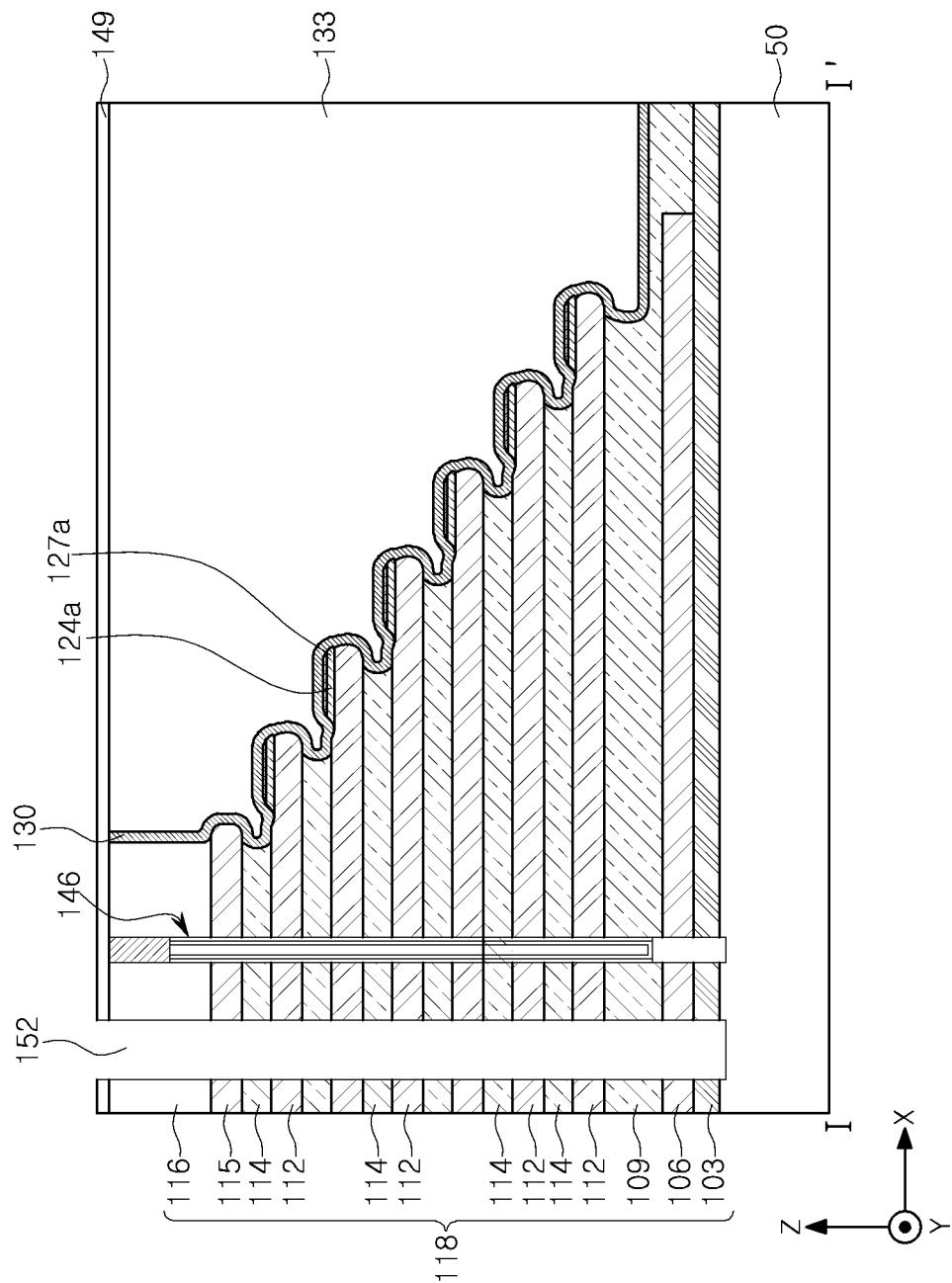

Referring to FIG. 20, a memory vertical structure 146 passing through the molded structure 118 is formed. The memory vertical structure 146 may be formed to have the same structure as that described with reference to FIG. 6. For example, referring to FIG. 20 together with FIG. 6, formation of the memory vertical structure 146 may include forming a hole passing through the molded structure 118, forming a semiconductor pattern 136 filling a lower portion of the hole, forming a gate dielectric structure 138 on a side wall of the hole on the semiconductor pattern 136, forming a vertical channel semiconductor layer 140 covering the gate dielectric structure 138 and the semiconductor pattern 136 in the hole, forming a core pattern 142 on the vertical channel semiconductor layer 140 to partially fill the hole, and forming a pad pattern 144 filling a remaining portion of the hole.

Next, a second capping insulation layer 149 covering the molded structure 118 and the first capping insulation layer 133 is formed. A trench 152 passing through the second capping insulation layer 149 and the molded structure 118 is then formed.

Figure 21:
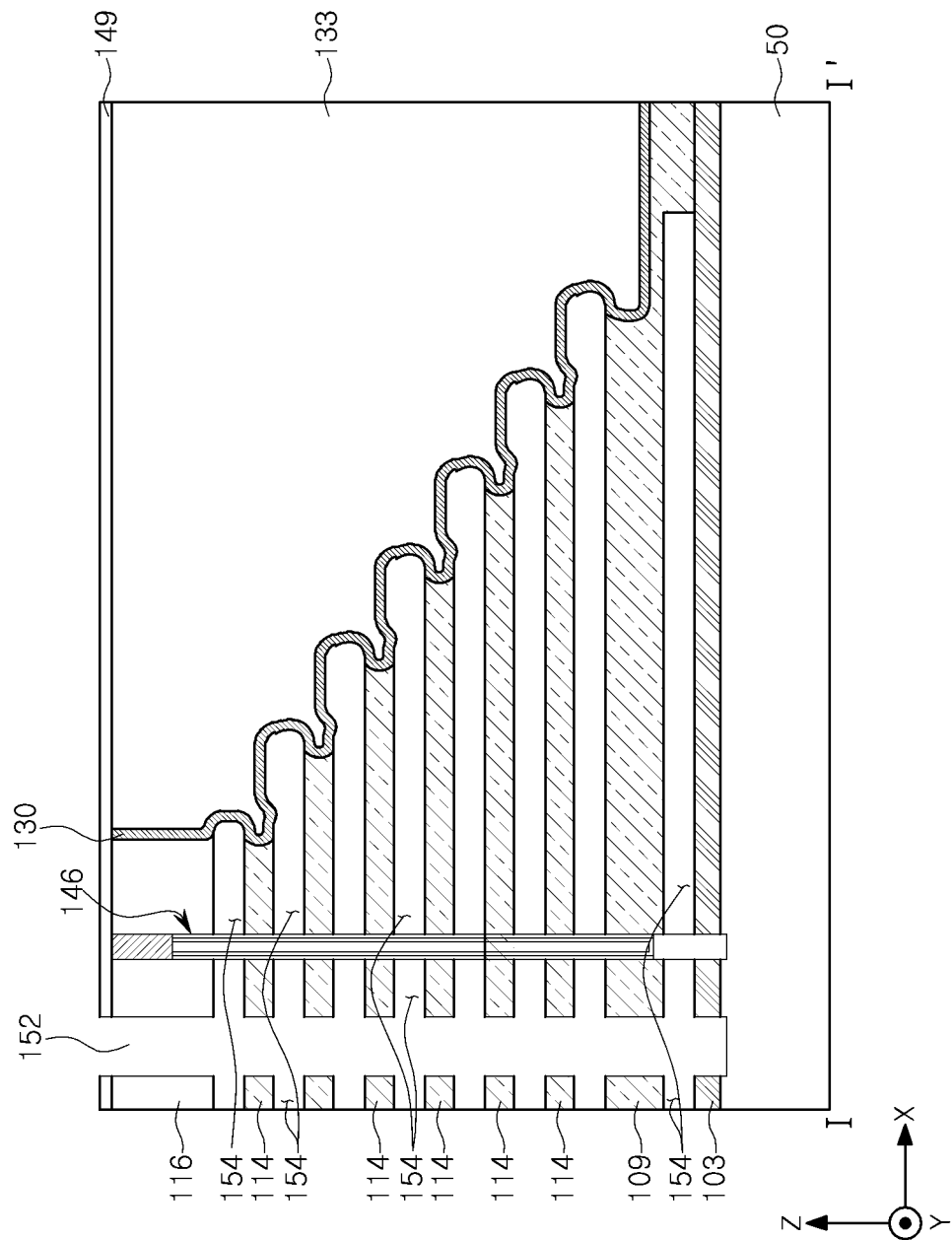

Referring to FIG. 21, the mold layers (106, 112, and 115 in FIG. 20) of the molded structure (118 in FIG. 20) exposed by the trench 152 are removed, and, in addition, the first and second pad mold layers 124a and 127a may be removed to form void spaces 154. The insulation liner 130 may function to prevent deformation of the void spaces 154 formed by removal of the first and second pad mold layers 124a and 127a. For example, the insulation liner 130 may be formed of a more dense film-like insulating material than the first capping insulation layer 133. The more dense film-like insulation liner 130 may prevent etching of the first capping insulation layer 133 which is relatively porous, during the etching process for removing the first and second pad mold layers 124a and 127a. Therefore, the insulation liner 130 may prevent defects that may occur due to deformation of the void spaces 154 including spaces formed by removal of the first and second pad mold layers 124a and 127a.

Referring again to FIG. 2B, gate patterns 158 may be formed in the void spaces (154 in FIG. 21). Therefore, the void spaces (154 in FIG. 21) may include a space formed by removing the first and second pad mold layers 124a and 127a, and the gate patterns 158 may be formed to have the upper, intermediate and lower gate pad regions 158Pa, 158P, and 158Pb as described with respect to FIG. 2B.

A dielectric layer 156 may be conformally formed in the void spaces 154, before forming the gate patterns 158.

Then, a separation structure 169 may be formed in the trench 152. A formation of the separation structure 169 may include forming separation spacers 163 on side walls of the trenches 152, and forming separation patterns 166 filling remaining portions of the trenches 152. A second capping insulation layer 172 may then be formed on the first capping insulation layer 149. A bit line contact plug 173 may be formed passing through the second and third capping insulation layers 149 and 172 and in contact with the memory vertical structure 146.

An upper gate contact plug 174a may be formed passing through the upper interlayer insulation layer 116 and the second and third capping insulation layers 149 and 172 and in contact with the upper gate pad region 158Pa. Intermediate gate contact plugs 174b may be formed passing through the first to third capping insulation layers 133, 149, and 172 and in contact with the intermediate gate pad regions 158Pb. A lower gate contact plug 174c may be formed passing through the first to third capping insulation layers 133, 149, and 172 and in contact with the lower gate pad regions 158Pb.

A bit line 180 may be formed on the bit line contact plug 173. An upper gate connection wiring line 182a may be formed on the upper gate contact plug 174a. Intermediate gate connection wirings 182b may be formed on the intermediate gate contact plugs 174b. A lower gate connection wiring 182c may be formed on the lower gate contact plug 174c.

According to embodiments of the inventive concepts, gate patterns including pad regions of increased thickness may be provided. Such pad regions with increased thickness may prevent occurrence of defects caused by penetration of the contact plugs. In addition, the degree of integration of semiconductor devices may be improved by stacking such gate patterns in a vertical direction. In addition, according to embodiments of the inventive concepts, outer side surfaces of the gate patterns including the pad regions of increased thickness may be provided in (or as having) rounded shape as previously described. Therefore, performance degradation or error of the semiconductor device due to the field concentration, which may occur at corners of end portions of the gate patterns, may be prevented.

According to embodiments of the inventive concepts, gate patterns including pad regions of increased thickness may be provided. The degree of integration of semiconductor devices may be improved by stacking in a vertical direction. In addition, according to embodiments of the inventive concepts, performance degradation or error of semiconductor devices due to the field concentration, which may occur at corners of end portions of gate patterns, may be prevented by providing outer side surfaces of the gate patterns including the pad regions having increased thickness in (or as having) rounded shape.

While exemplary embodiments have been shown and described above, it should be apparent to those skilled in the art that modifications and variations could be made without departing from the scope of the inventive concepts as defined by the appended claims.

What is claimed is:

1. A semiconductor device comprising:
a gate pattern disposed over a lower structure, and including a gate electrode region and a gate pad region extending from the gate electrode region; and
a vertical channel semiconductor layer having a side surface facing the gate electrode region of the gate pattern,
wherein the gate pad region includes a first pad region having a thickness greater than a thickness of the gate electrode region,
the first pad region includes an upper surface, a lower surface opposing the upper surface, and an outer side surface,
the outer side surface has a lower outer side surface and an upper outer side surface, divided from each other by a boundary portion, and
the lower outer side surface extends from the lower surface in a rounded shape.

2. The semiconductor device according to claim 1, wherein the lower outer side surface has a convex shape, and
wherein a connection portion of the lower outer side surface and the lower surface has a rounded shape.

3. The semiconductor device according to claim 2, wherein the upper outer side surface has a convex shape and extends from the upper surface, and a connection portion of the upper outer side surface and the upper surface has a rounded shape, and
the boundary portion of the outer side surface is a concave portion formed by connecting the lower outer side surface having the convex shape and the upper outer side surface having the convex shape.

4. The semiconductor device according to claim 2, wherein at least a portion of the upper outer side surface has a concave shape, and
the boundary portion of the outer side surface is an inflection portion at a connection portion of the lower outer side surface having the convex shape and the portion of the upper outer side surface having the concave shape.

5. The semiconductor device according to claim 2, wherein the upper outer side surface comprises:
a first upper outer side surface extending at an obtuse angle with respect to the upper surface; and
a second upper outer side surface extending from the first upper outer side surface with a slope different than a slope of the first upper outer side surface.

6. The semiconductor device according to claim 1, wherein the gate pad region further includes a second pad region between the first pad region and the gate electrode region, and
the second pad region includes a portion having a thickness smaller than the thickness of the gate electrode region.

7. The semiconductor device according to claim 1, wherein a relatively lower portion of the lower outer side surface protrudes further in a lateral direction than a relatively upper portion of the lower outer side surface.

8. The semiconductor device according to claim 1, wherein the lower outer side surface protrudes further in a lateral direction than the upper outer side surface.

9. A semiconductor device comprising:
a first gate pattern over a lower structure;
a second gate pattern over the first gate pattern;
an interlayer insulation layer between the first gate pattern and the second gate pattern; and
a contact plug on the first gate patter,
wherein the first gate pattern includes a gate electrode region overlapping with the second gate pattern, and a gate pad region extending from the gate electrode region, the gate pad region includes a first pad region having a thickness greater than a thickness of the gate electrode region,
wherein the first pad region includes a lower region and an upper region on the lower region,
wherein the lower region includes a lower outer side surface having a convex shape,
wherein the contact plug is in contact with the gate pad region of the first gate pattern and is spaced apart from the second gate pattern, and
wherein a width of the first pad region of the gate pad region is greater than a width of the contact plug.

10. The semiconductor device according to claim 9, wherein the first and second gate patterns protrude further than the interlayer insulation layer in a direction parallel to an upper surface of the lower structure.

11. The semiconductor device according to claim 9, wherein the second gate pattern has a lower surface and an outer side surface extending from the lower surface, and a connection portion of the lower surface and the outer side surface has a rounded shape.

12. The semiconductor device according to claim 9, wherein the upper region includes an upper outer side surface, and
the first pad region includes a boundary portion, which divides the lower outer side surface of the lower region and the upper outer side surface of the upper region.

13. The semiconductor device according to claim 12, wherein a thickness of the lower region is greater than a thickness of the upper region.

14. The semiconductor device according to claim 12, wherein the upper region includes a first upper region, and a second upper region between the first upper region and the lower region,
- the upper outer side surface includes a first upper outer side surface of the first upper region, and a second upper outer side surface of the second upper region, and
- the first upper outer side surface and the second upper outer side surface have different shapes.

15. The semiconductor device according to claim 12, wherein the upper region includes a raised side surface opposing the upper outer side surface, and
- wherein the raised side surface includes a first raised side surface extending from an upper surface of the upper region and forming an obtuse angle with the upper surface of the upper region, and a second raised side surface extending from the first raised side surface and having a more acute slope than the first raised side surface.

16. A semiconductor device comprising:
- a lower structure;
- gate patterns spaced apart from each other in a direction perpendicular to an upper surface of the lower structure, the gate patterns including intermediate gate patterns; and
- a vertical channel semiconductor layer having a side surface facing the intermediate gate patterns,
- wherein each of the intermediate gate patterns includes a gate electrode region overlapping with a gate pattern from among the gate patterns positioned at a relatively upper portion, and a gate pad region extending from the gate electrode region,
- the gate pad region includes a first pad region, and a second pad region between the gate electrode region and the first pad region,
- the first pad region has a thickness greater than a thickness of the gate electrode region and a thickness of the second pad region,
- the first pad region includes a lower outer side surface, an upper outer side surface, and a boundary portion between the upper outer side surface and the lower outer side surface, and
- a connection portion of a bottom surface of the first pad region and the lower outer side surface of the first pad region has a rounded shape.

17. The semiconductor device according to claim 16,
- wherein the intermediate gate patterns include a first gate pattern, a second gate pattern over the first gate pattern, and one or more third gate patterns over the first gate pattern and in a position lower than a position of the second gate pattern,
- the gate pad region of each of the first and second gate patterns extends from the gate electrode region in a first horizontal direction, and
- outer side surfaces of the one or more third gate patterns positioned in the first horizontal direction extend from lower surfaces of the one or more third gate patterns in a rounded shape.

18. The semiconductor device according to claim 17, wherein relatively lower portions of the outer side surfaces of the one or more third gate patterns protrude further in a lateral direction than relatively upper portions of the outer side surfaces of the one or more third gate patterns.

19. The semiconductor device according to claim 16, wherein the gate patterns further include a lower gate pattern in a position lower than a position of the intermediate gate patterns, and
- a connection portion of the bottom surface of the first pad region and the lower outer side surface of the first pad region has a more rounded shape than a connection portion of a lower surface of the lower gate pattern and an outer side surface of the lower gate pattern.

20. The semiconductor device according to claim 19, wherein the gate patterns further include an upper gate pattern over the intermediate gate patterns, and
- a connection portion of a lower surface of the upper gate pattern and an outer side surface of the upper gate pattern has a more rounded shape than the connection portion of the lower surface of the lower gate pattern and the outer side surface of the lower gate pattern.

* * * * *